(12) United States Patent
Xie et al.

(10) Patent No.: US 6,936,545 B1
(45) Date of Patent: Aug. 30, 2005

(54) ORGANIC MEMORY CELL FORMATION ON AG SUBSTRATE

(75) Inventors: James J. Xie, San Jose, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/676,612

(22) Filed: Oct. 1, 2003

(51) Int. Cl.[7] ..................... H01L 21/302; H01L 21/461
(52) U.S. Cl. ........................ 438/692; 438/637
(58) Field of Search ................ 438/672, 619, 438/675, 637, 640, 687, 692

(56) References Cited

U.S. PATENT DOCUMENTS 6,706,625 B1 * 3/2004 Sudijono et al. ............ 438/637

* cited by examiner

*Primary Examiner*—PHuc T. Dang
(74) *Attorney, Agent, or Firm*—Amin & Turocy, LLP

(57) ABSTRACT

Systems and methods are disclosed for creating memory cells on a silver interconnect substrate. The silver substrate is initially subject to a CMP process followed by cycles of exposure to inorganic and organic acids, as well as growing $Ag/Ag_2S$ layers. The resulting smooth Ag interconnect surface is then employed for basing the memory cell layers thereupon.

12 Claims, 19 Drawing Sheets

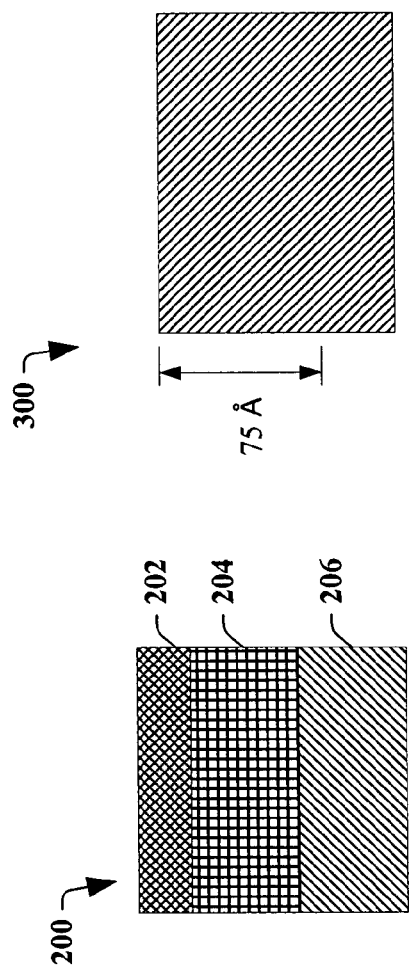
Fig. 2
Fig. 3
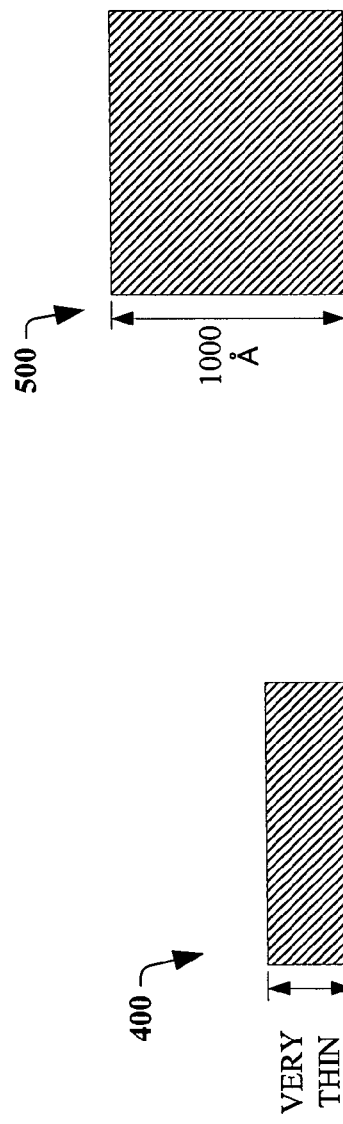
Fig. 5
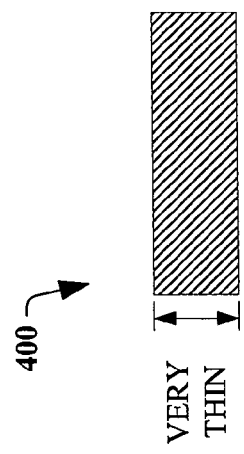
Fig. 4

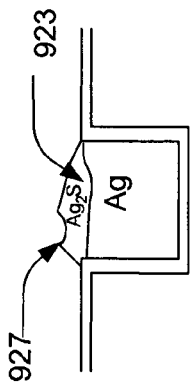
Fig. 22(a)
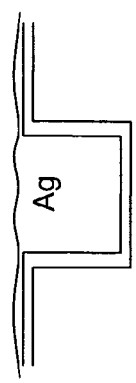
Fig. 22(d)
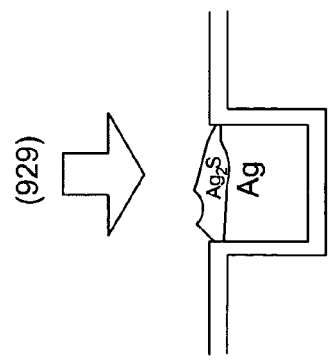
Fig. 22(b)
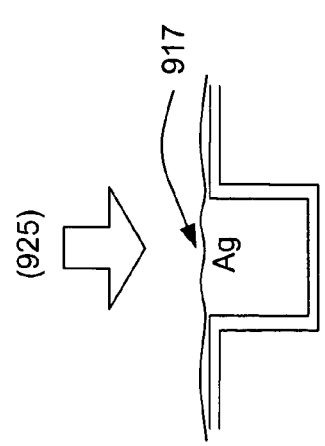
Fig. 22(e)
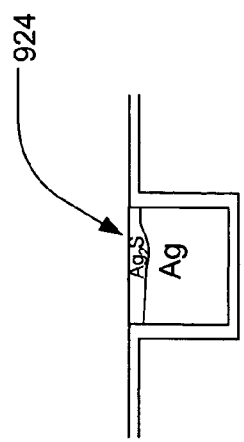
Fig. 22(c)
Fig. 22(f)

ORGANIC MEMORY CELL FORMATION ON AG SUBSTRATE

FIELD OF THE INVENTION

The present invention relates generally to semiconductor fabrication and, in particular to systems and methods of forming an organic memory cell on a silver substrate.

BACKGROUND OF THE INVENTION

Generally, copper wires are extensively employed as interconnections on a chip when applying the damascene process in semiconductor fabrication. As the semiconductor device densities are reduced, there is a desire to reduce the cross sectional area of the copper interconnects and/or its pathway distance. This can typically result in an increased resistance of the copper interconnect, which in turn can require a larger voltage and current to drive a signal. The larger voltage and current can result in a greater risk for capacitive coupling and signal errors during the operation of the integrated circuit. Moreover, the stringent demand placed on interconnects for advanced ultra-large-scale integration (ULSI) technologies, may compel metallization schemes other than copper based designs to achieve high current densities and faster switching speeds.

At the same time, there is a continuous desire to increase the storage capacity of the integrated circuit, as computers are consistently becoming more powerful and new and improved electronic devices are continually developed (e.g., digital audio players, video players). Such growth and development has vastly increased the amount of information required to be stored in the semiconductor chip or the integrated circuit and its memory cells.

A relatively recent type of memory cell is an organic based memory cell. Organic memory cells are at least partly based on organic materials and, are thus able to overcome some of the limitations of inorganic based memory cells. Organic memory cells facilitate increases in device density, while also increasing device performance relative to conventional inorganic memory cells. Additionally, organic memory cells are non-volatile and, as such; do not require frequent refresh cycles or constant power. Such cells can have two or more states corresponding to various levels of impedance. These states are set by applying a bias voltage, and then the cells remain in their respective states until another voltage, in reverse bias, is applied. The cells maintain their states with or without power (e.g., non-volatile) and can be read either electrically or optically by measuring injection current or light emission, for example.

Typically, these multiple layered memory cells can be formed with difficulty, unless the substrate topography is planarized in an early stage of the manufacturing process. Put differently, the substrate topography should be as close to a planar and smooth surface as possible. Problems arise when micro scratches that adversely affect surface smoothness are formed during the chemical mechanical polishing process (CMP) step of the semiconductor fabrication.

In general, fabricating an integrated circuit (IC) includes sequentially depositing conducting, semi conducting and/or insulating layers on a silicon wafer, wherein portions of the conductive metal remaining between the raised patterns of an insulating layer can form vias, plugs and/or lines that are filled with a conducting metal. One step in the fabrication process is the CMP.

Typically, the CMP process involves holding a thin flat wafer against a rotating wetted polishing surface under a controlled downward pressure. A polishing slurry, such as a solution of alumina or silica, may be used as the abrasive medium. A rotating polishing head or wafer carrier is generally employed to hold the wafer under controlled pressure against a rotating polishing platen. The polishing platen is typically covered with a relatively soft wetted pad material such as blown polyurethane.

The mechanics of metal CMP include, for example, chemically forming an oxide of the metal on the metal film surface on the wafer. The oxide is then removed mechanically via, for example, abrasives in the slurry. The mechanics of other CMP (e.g., polysilicon polish, dielectric polish) similarly involve a chemical reaction followed by a mechanical removal of reaction products.

The polishing pad facilitates removing reaction products at the wafer interface to facilitate layer thickness production. For example, CMP processes can be employed to remove around 0.5 to 1.0 $\mu$m of material. The polishing pads may vary, for example, in hardness and density. For example, pads can be relatively stiff or relatively flexible. A less stiff pad will conform more easily to the topography of a wafer and thus while reducing planarity may facilitate faster removal of material in down areas. Conversely, a stiffer pad may produce better planarity, but may result in slower removal in down areas.

Some goals of CMP include achieving general planarity across a wafer, creating a desired film thickness uniformity, removing chemical reaction products and/or layers at a desired rate and achieving desired selectivity and/or endpoint. The achievement of these goals partly depend upon, the concentration of solids in the slurry (e.g. the number and size of abrasive particles suspended in the slurry), the chemical composition of the slurry (e.g. the pH of the slurry and/or the presence of acids or bases added to the slurry to facilitate chemical reactions associated with CMP processing), the distribution of the slurry, the degree of contact between one or more polishing pads, polishing pad attributes (e.g. porosity, density, flexibility), the rate at which slurry is fed onto polishing pads and/or the wafer and the size, number and arrangement of grooves machined into the bulk silicon wafer to channel slurry about the entire wafer surface. The degree of wafer-pad contact can, for example, affect the uniformity of slurry as polishing pads rotate and move relative to the wafer, thus, pushing slurry around on the wafer.

The rate at which CMP progresses may also vary depending on parameters of the slurry employed. Slurries may consist, for example, of small abrasive particles suspended in a solution (e.g., aqueous solution). Acids or bases can be added to such solutions to facilitate, for example, the oxidation of the metal on the wafer and/or other chemical reactions involved in other non-metal CMP processes. Slurry parameters that can impact polishing rates include, for example, the chemical composition of the slurry, the concentration of solids in the slurry, the solid particles in the slurry and the temperature of the wafer to which the slurry is applied.

A particular problem encountered in the CMP process is the formation of micro scratches on the polished surface. These micro scratches may be damaging to the inter-connection levels created during the damascene technique, for example because the metal layer that is deposited on the surface will become trapped in the scratch, thus causing short failure of the IC chip. Also, these micro-structure irregularities adversely affect the smoothness and planarity of the substrate layer upon which the organic memory cells are to be subsequently formed. Accordingly, there exists a need in the art to provide a reliable way to remove scratches formed in the substrate layer that form the base of the organic memory cells.

At the same time, the need for higher circuit densities and faster switching speeds generally compels the formation of these organic memory cells on a substrate layer that demonstrates improved conductive electrical properties over the conventional copper substrate. Thus, there also exists a need in the art to form the organic memory cell structures on metallization schemes with improved electrical conductivity.

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter.

The invention provides for a system and method for forming an organic memory cell on a surface of a post CMP layer of silver (Ag) interconnects. Such organic memory cell can include two electrodes with a selectively conductive media between the two electrodes. The selectively conductive media contains an organic conductor layer and one or more passive layers. Moreover, the selectively conductive media is programmed (e.g., written) by applying bias voltages that programs a desired impedance state into the memory cell. The desired impedance state represents one or more bits of information and does not require a constant power supply or refresh cycles to maintain the desired impedance state. The impedance state of the selectively conductive media is read by applying a current and then reading the impedance of the selectively conductive media. As with the written impedance state, the read impedance state represents one or more bits of information.

In one or more aspects according to the present invention, Ag interconnects are employed instead of all, or part, of the Cu interconnects. The Ag interconnect layer can be further subject to a post CMP treatment as to create a polished surface with a smooth texture, which can typically form the base of a memory cell subsequently created thereupon.

According to one aspect of the invention, the post CMP surface of the Ag interconnect is exposed to an inorganic acid, such as for example an $H_2S$, $HNO_3$ $H_3PO_4$, HCL, or the like. Exposure to the acid can create depressions on the surface of Ag interconnect, (e.g., in the form of shallow trenches, voids, surface irregularities and the like), which can penetrate through the surface, as well as part of the under lying silver interconnect. The exposure to the acid may occur in cycles or in one stage. In addition, the exposure time to the acid, concentration, and type of acid can in part depend on the desired pattern of the surface depressions and the type of memory structure that is subsequently formed on the silver layer being treated according to the present invention.

Next, an empty space in the depression is employed for forming a passive layer, such as an $Ag_2S$ formation. To facilitate growth of such formation, $H_2S$ is brought into contact with the depression. This passive layer is created such that its rough surface crest protrudes out of the surface depression and extends beyond the level of the initial post CMP surface of the silver interconnect. The passive layer(s) will typically form the substrate layer for the memory cells later created thereupon- In general, such memory cells are composed of organic material such as polymers, which are formed within an Inner Layer Dielectric (ILD) of an organic semiconductor memory device. Such structures are formed over a passive layer, which in turn is formed over a conductive material such as the silver interconnect layer. This silver layer can form the lower electrode of the memory cell, subject to a CMP process and the post treatment acid exposure according to one aspect of the present invention.

Subsequently, an organic acid is brought into contact with the surface of the passive layer, e.g. the $Ag_2S$ layer, as to flatten and etch its rough crest protrusion to a desired level. The organic acid can be a tartaric acid, ascorbic acid, succinic acid, fumaric acid, formic acid, citric acid, oxalic acid, malic acid, propionic acid, pyruvic acid or the like. The acid exposure process smoothens the surface of the passive layer and typically facilitates the formation of the memory cell structure.

In one aspect according to the present invention, the passive layer to be leveled to the desired level is an $Ag/Ag_2S$ layer that has been platted via an electroless deposition reaction. The electroless plating process operates at relatively low temperatures, without employing electrical currents, and creates various conductive layers, such as electrodes and the like, from conductive materials. The process includes depositing an activation compound on selected areas and thereafter applying a chemical solution, which contains a reducing agent and metal ions. A chemical reaction occurs that reduces the metal ions and thereby plats the metal ions as to form a conductive layer.

In another aspect according to the invention, the silver sulfide ($Ag_2S$, AgS) passive layer can further comprise compositions of a copper oxide ($CuO/Cu_2O$), manganese oxide ($MnO_2$), titanium dioxide ($TiO_2$), indium oxide ($I_3O_4$) iron oxide $Fe_3O_4$), and the like.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

BRIEF DESCRIPTION OF THE DRAWINGS

FIG. 2 is a block diagram of a passive layer that can be employed in an organic memory device in accordance with an aspect of the present invention.

FIG. 3 is a block diagram illustrating an organic polymer layer formed by a CVD process in accordance with an aspect of the present invention.

FIG. 4 is a block diagram illustrating another organic polymer layer formed by a CVD process in accordance with an aspect of the present invention.

FIG. 5 is a block diagram of yet another organic polymer layer formed by a CVD process in accordance with an aspect of the present invention.

FIGS. 22(a) through 22(f) illustrate schematic diagrams of the post CMP surface treatment of an Ag interconnect according to one aspect of the present invention.

DETAILED DESCRIPTION OF THE INVENTION

Figure 1:
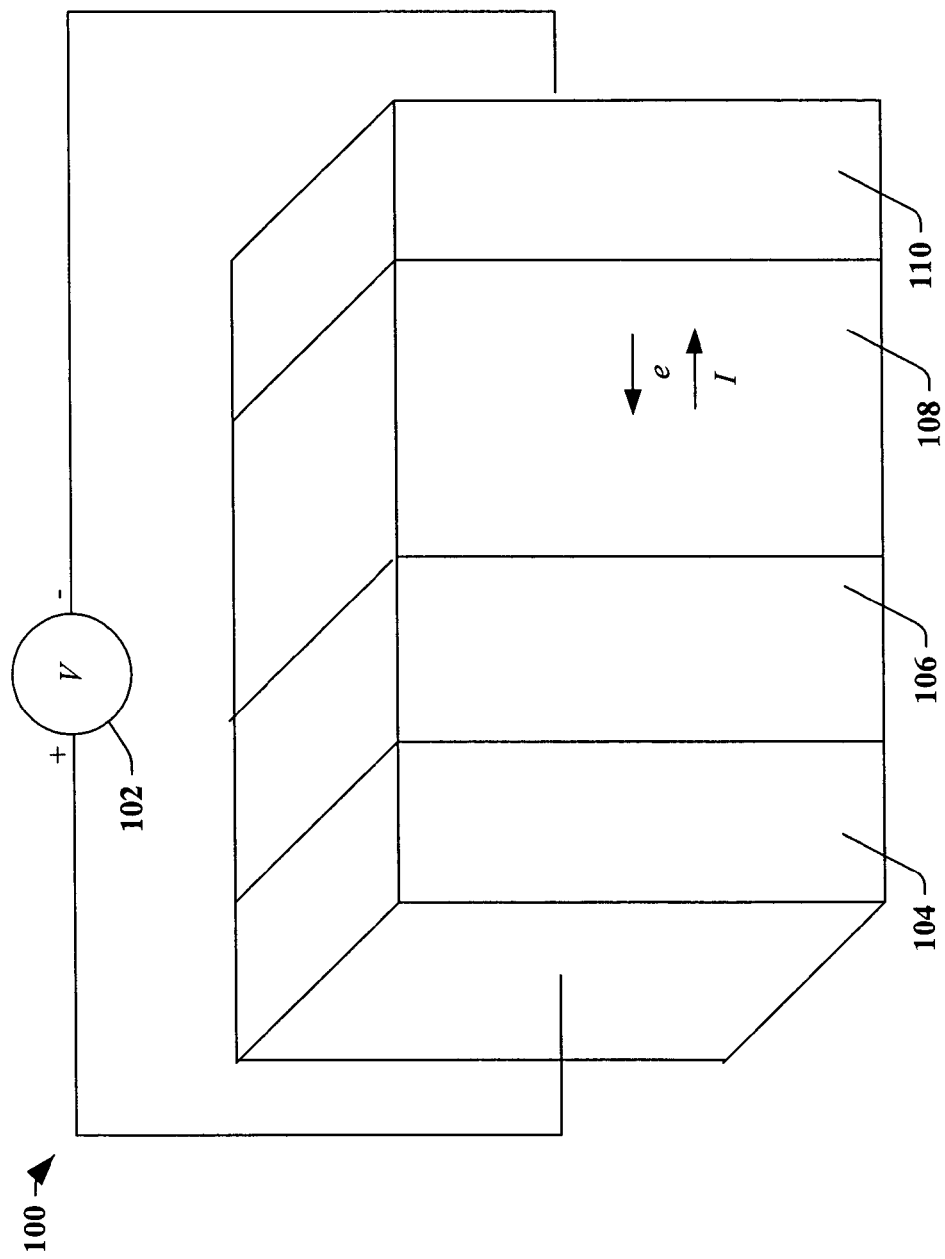
FIG. 1 is a perspective of an organic memory device in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

The invention provides for a system and method for a post CMP precursor treatment that creates a smooth and well polished Ag surface for the formation of organic memory cells. Such cells of the organic memory device are operative to be of two or more states corresponding to various levels of impedance. These states are set by applying a bias voltage and then the cells remain in their respective states until another voltage, in reverse bias, is applied. The cells maintain their states with or without power (e.g., non-volatile) and can be read either electrically or optically by measuring injection current or light emission. Such organic memory device created on an Ag substrate facilitates increases in device density, while also increasing device performance relative to conventional inorganic memory device.

Additionally, the organic memory device of the present invention employs electronic stimulation (e.g., flow of electrons and holes) instead of ions and/or electric fields. Thus, the organic memory device can have better performance and/or a quicker response to changes in stimuli as compared to other types of memory devices.

Referring to FIG. 1, a perspective diagram of an organic memory device that can be formed on an Ag substrate in accordance with an aspect of the present invention is depicted. The memory device includes a first electrode 104, a passive layer 106, an organic polymer layer 108, and a second electrode 110. The diagram also illustrates a voltage source 102 connected to the first electrode 104 and the second electrode 110 that applies a voltage on the first electrode 104 and the second electrode 110.

The first electrode 104 and the second electrode 110 are comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the first electrode 104 and the second electrode 110 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 108 and the passive layer 106 are collectively referred to as a selectively conductive media or selectively conductive layer. The conductive properties of this media (e.g., conductive, non-conductive, semi-conductive) can be modified in a controlled manner by applying various voltages across the media via the electrodes 104 and 110.

The organic layer 108 is comprised of a conjugated organic material, such as a small organic molecule and a conjugated polymer. If the organic layer is polymer, a polymer backbone of the conjugated organic polymer may extend lengthwise between the electrodes 104 and 110 (e.g., generally substantially perpendicular to the inner, facing surfaces of the electrodes 104 and 110). The conjugated organic molecule can be linear or branched such that the backbone retains its conjugated nature. Such conjugated molecules are characterized in that they have overlapping 71 orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt). A more detailed discussion of the composition of the organic layer 108 is described infra.

The organic layer 108 has a suitable thickness that depends upon the chosen implementations and/or the memory device being fabricated. Some suitable exemplary ranges of thickness for the organic polymer layer 108 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic layer 108 can be formed via a number of suitable techniques. One suitable technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometimes it may have a chemical bond formed between the conjugated organic polymer and the passive layer 106.

The passive layer 106 contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 108. The particular conductivity facilitating compound employed is selected so that the two relatively stable states match with the two relatively stable states of the conjugated organic molecule of the layer 108.

The passive layer 106 is operative to transport charge from the first electrode 104 to the interface between the organic layer 108 and the passive layer 106. Additionally, the passive layer 106 facilitates charge carrier (e.g., electrons or holes) injection into the organic layer 108 and increases the concentration of the charge carrier in the organic layer resulting in a modification of the conductivity of the organic layer 108. Furthermore, the passive layer 106 can also store opposite charges in the passive layer 106 in order to balance the total charge of the device 100.

The passive layer 106 can in some instances act as a catalyst when forming the organic layer 108. In this connection, the backbone of the conjugated organic molecule may initially form adjacent the passive layer 106, and grow or assemble away and substantially perpendicular to the passive layer surface. As a result, the backbones of the conjugated organic molecule may be self aligned in a direction that traverses the two electrodes.

Examples of conductivity facilitating compounds that may make up the passive layer 106 include one or more of copper sulfide ($Cu_2S$, $CuS$), copper oxide ($CuO$, $Cu_2O$), manganese oxide ($MnO_2$), titanium dioxide ($TiO_2$), indium oxide ($I_3O_4$), silver sulfide ($Ag_2S$, $AgS$), , iron oxide ($Fe_3O_4$), and the like. The passive layer 106 may be grown using oxidation techniques, formed via gas phase reactions, or deposited between the electrodes.

The passive layer 106 has a suitable thickness that can vary based on the implementation and/or memory device being fabricated. Some examples of suitable thicknesses for the passive layer 106 are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

In order to facilitate operation of the organic memory device, the organic layer 108 is generally thicker than the passive layer 106. In one aspect, the thickness of the organic layer is from about 0.1 to about 500 times greater than the thickness of the passive layer. It is appreciated that other suitable ratios can be employed in accordance with the present invention.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information. . . ).

During typical device operation, electrons flow from the second electrode 110 through the selectively conductive media to the first electrode 104 based on a voltage applied to the electrodes by the voltage source 102 if the organic layer is n-type conductor. Alternately, holes flow from the first electrode 104 to second electrode 110 if the organic layer 108 is p-type conductor, or both electrons and holes flow in the organic layer if it can be both n and p type with proper energy band match with 106 and 110. As such, current flows from the first electrode 104 to the second electrode 110 via the selectively conductive media.

Switching the organic memory device to a particular state is referred to as programming or writing. Programming is accomplished by applying a particular voltage (e.g., 9 volts, 2 volts, 1 volts, . . . ) across the selectively conductive media via the electrodes 104 and 110. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on"...). The threshold value varies depending upon a number of factors including the identity of the materials that constitute the organic memory device, the thickness of the various layers, and the like. The voltage supply 102 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 2 volts, 1 volts, 0.5 volts) is applied via the voltage source 102. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

FIG. 2 is a block diagram that depicts fabrication of a passive layer 200 in accordance with an aspect of the present invention. A $Cu_yS$ layer is formed by a gas phase reaction operation. A first layer 206 is formed that comprises Cu. A second layer 204 is formed on the first layer. The second layer comprises $Cu_yS$ (e.g., $Cu_2S$, CuS or mixture thereof) and has a thickness of about 20 Å or more. A third layer 202 is formed on the second layer 204. The third layer 202 contains $Cu_2O$, and/or CuO and generally has a thickness of about 10 Å or less. It is appreciated that alternate aspects of the invention can employ suitable variations in composition and thickness and still be in accordance with the present invention.

FIG. 3 is a block diagram illustrating an organic layer 300 formed by a chemical vapor deposition (CVD) process in accordance with an aspect of the present invention. The organic layer 300 is formed via a gas phase reaction process. Typically, the organic layer 300 is formed in contact with a passive layer and an electrode. The organic layer 300 is comprised of polymer polydiphenylacetylene (DPA). This polymer layer, as shown in FIG. 3, is fabricated to be about 65 Å thick.

Turning now to FIG. 4, a block diagram depicting another organic layer 400 formed from a CVD process in accordance with an aspect of the present invention is illustrated. Once again, the organic layer 400 is formed via a gas phase reaction process. The organic layer 400 is formed in contact with a passive layer and an electrode. The organic polymer layer 402 is comprised of polymer polyphenylacetylene (PPA). Referring to FIG. 5, a block diagram of another organic layer 500 formed by spin coating in accordance with an aspect of the present invention is illustrated. The organic layer 500 is formed via a spin coating process, instead of a gas phase reaction process. The organic layer 500 is formed in contact with a passive layer and an electrode. The organic layer 500 is comprised substantially of PPA and has a thickness of about 1000 Å.

Experimental results tend to show that organic layers formed via spin coating yield a more reliable polymer layer than polymer layers formed via CVD. This may be due to the presence of oxygen and lack of control of heat generated by polymerization under CVD. It is appreciated that controlling heat and oxygen during polymerization for CVD processes can improve the resulting polymer layer. Additionally, organic layers created via CVD are generally thinner than those created with other methods.

It is appreciated that various alternatives to and variations of the layers described in FIGS. 2–5 can be employed in accordance with the present invention.

The passive layer (e.g., CuS) employed in organic memory devices play an important role. Its presence significantly improves the conductivity of the organic layer. This characteristic is at least partially a function of the following: charge carrier generated by CuS, build up of a charge depletion layer, charge carrier distribution in organic material, and memory loss due to charge carrier redistribution after reversing electric field. The discussion infra describes and illustrates charge carrier concentration and models behavior of organic memory devices.

In the following example, conductive polymer is used as organic material, and CuS is used as passive layer material. With respect to charge carrier generation, the copper in CuS is at its highest oxidation state Cu(II). It has relatively strong capability to gain electrons from a contacting polymer and yields the following equation:

$$Cu(II)S + Polymer \rightarrow Cu(I)S^- + Polymer^+ \quad (1)$$

Figure 6:
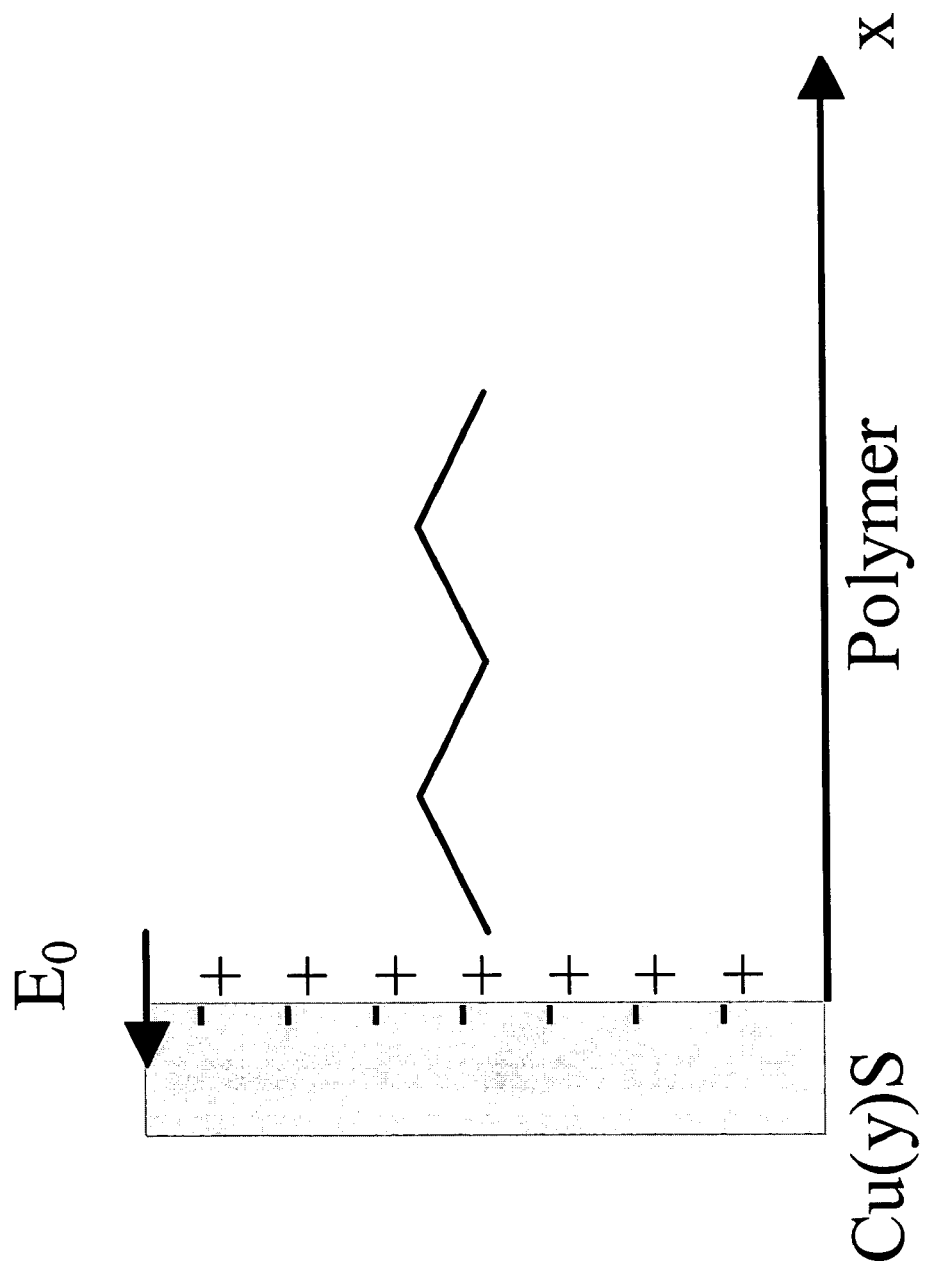
FIG. 6 is a graph depicting the effect of an intrinsic electric field on an interface between a passive layer and an organic polymer layer in accordance with an aspect of the present invention.

The consequence is that an intrinsic field is produced due to the charges accumulated on the interface between CuS and polymer. This is shown in FIG. 6, which is a graph depicting the effect of an intrinsic electric field on an interface between Cu(y)S and a polymer is provided. The oxidized polymer (Polymer$^+$) is the charge carrier when external field is applied. The conductivity of polymer is determined by its concentration and its mobility.

$$\sigma = q\,p\,\mu \quad (2)$$

Where q is the charge of the carrier, p is carrier concentration and $\mu$ is the mobility.

Referring now to the charge depletion layer, employing a similar concept as applied with respect to semiconductors, a potential function can be expressed as:

$$V(x) = qN_p(d_p x - x^2/2)/\epsilon \quad (3)$$

where $N_p$ is the average concentration of charge carrier, $\epsilon$ is the dielectric constant of the polymer, and $d_p$ is the width of the charge depletion. $N_p$ can be obtained by employing the following equation:

$$d_p = \left[\frac{2\epsilon(V_b \pm V)}{qN_p}\right]^{1/2} \quad (4)$$

where V is the external field voltage applied. For forward voltage, it is "−" sign. For the reverse voltage, it is "+" sign.

The voltage function of Eq. (3) can be approximated to simplify the derivation.

With respect to charge carrier distribution, like p-doping of a semiconductor, two processes typically take place in the electric field. This flux can be expressed as:

$$J = -qD\frac{dp}{dx} + q\mu pE \qquad (5)$$

where D is diffusion constant of the charge carrier, and E is the electric field at x.

If there is no current, the carrier distribution is:

$$p(x)=p(0)exp([(V(0)- V(x))/Vt]) \qquad (6)$$

where p(0) is the concentration, V(0) is voltage at the interface respectively, and $V_t$=kT/q.

When forward voltage is so large that the current flux J>0, the analytical equation can be derived for steady state flow with some assumption for the voltage distribution in the cell. Overall, under forward voltage, the charge distribution p(x) is an increase function of x. When reverse voltage is applied, $V(x)>V_0$, the charge concentration is a decrease function of x.

The final characteristic, retention time, refers to the fact that a forward voltage produces more charge carrier and the charge carrier accumulates more on the other end of the passive (CuS) layer (away from the organic polymer). However, this charge carrier concentration will be set back once the voltage is removed, which includes two processes: charge carrier diffusion toward the CuS layer and charge carrier recombination on the interface. Fick's Law can describe the 1st process, charge carrier diffusion toward the CuS layer.

The charge carrier recombination can be described as follows:

$$Cu(I)S^-+Polymer^+ \rightarrow Cu(II)S+Polymer \qquad (7)$$

The retention time is the time required to redistribute the charge carrier to the original state. It is likely that the reaction rate is relatively faster than diffusion rate. Therefore, the retention time can be substantially determined by the diffusion process only.

An exemplary memory cell is considered herein with respect to the equations 1–9 discussed supra and illustrated in FIGS. 7–12. The exemplary cell is considered with parameters intrinsic voltage $V_b$=0.02V, equilibrium constant $K_{eq}$=2.17×10$^{-4}$, concentration of CuS and Polymer at interface [Polymer]$_0$=[CuS]$_0$ $_{m=}$10$^{23}$/cm$^3$, polymer thickness d=5×10$^{-5}$ cm (0.5 um), and CuS thickness $d_{CuS}$=5×10$^{-7}$ cm (0.005 um). Six typical cases are calculated to illustrate electrical operation of an organic memory device in accordance with an aspect of the present invention.

Figure 7:
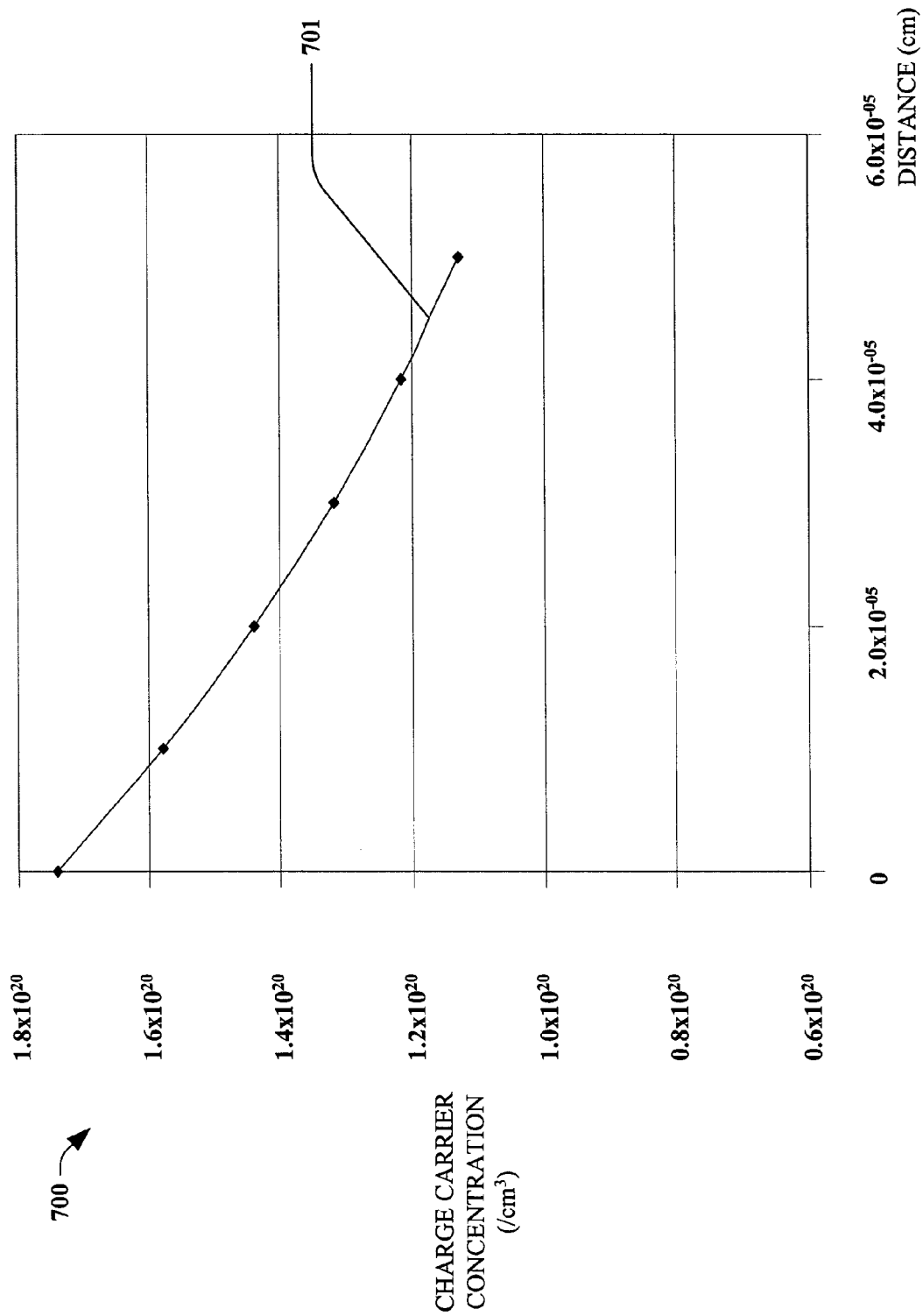
FIG. 7 is a graph illustrating charge carrier distribution of an exemplary memory cell in accordance with an aspect of the present invention.

FIG. 7 depicts a graph 700 of charge carrier distribution 701 of the exemplary memory cell as a function of distance from the CuS and organic polymer interface in accordance with an aspect of the invention. The charge carrier concentration 701 is shown as being a decreasing function of distance (x) from the interface. This graph 700 assumes an external voltage V=0 and a current J=0. The charge carrier concentration 701 is derived utilizing Eq. 6 with a constant field assumption. However, the points shown are independent of the constant field assumption.

Figure 8:
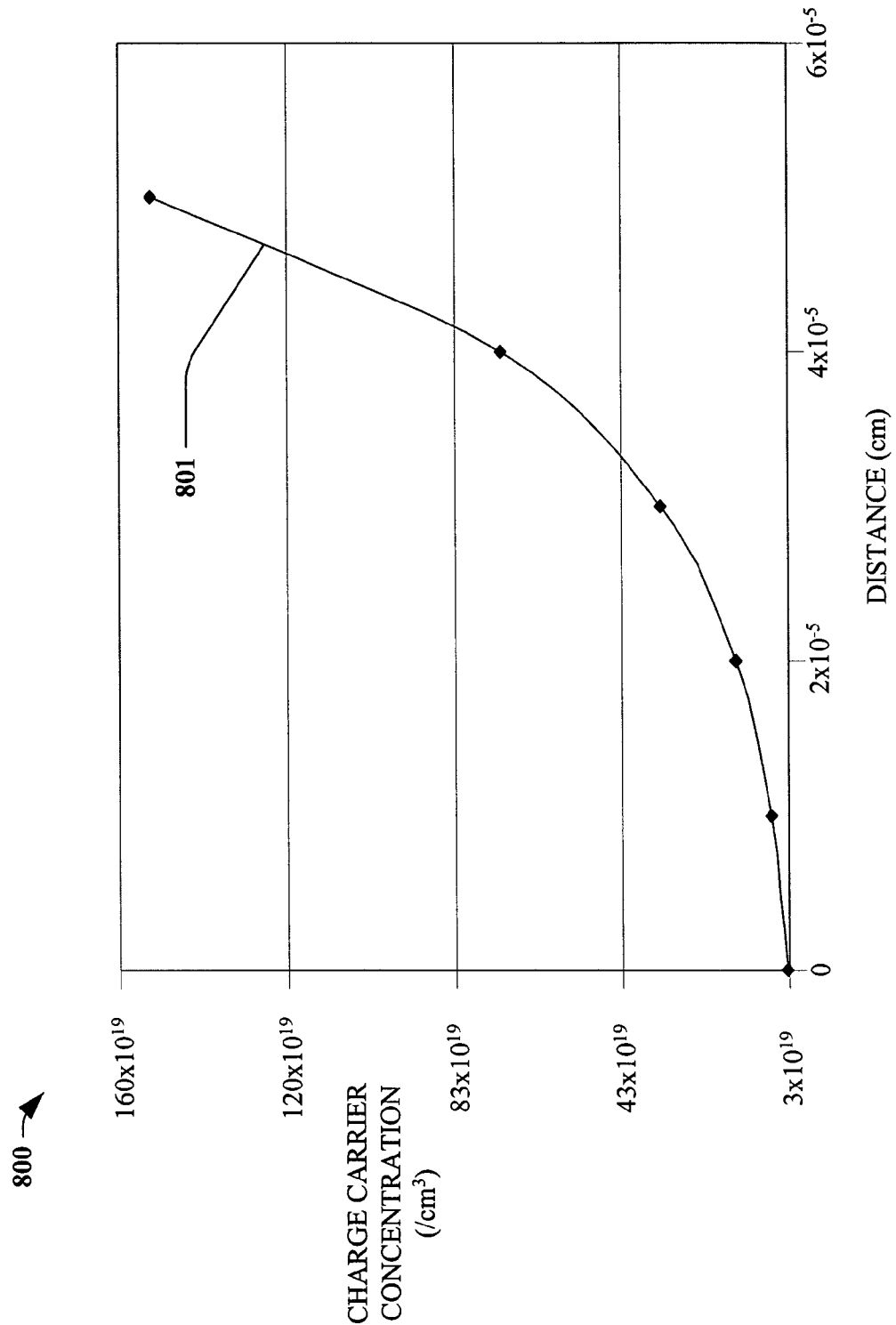
FIG. 8 is a graph illustrating charge carrier distribution of an exemplary memory cell in accordance with an aspect of the present invention.

Turning now to FIG. 8, another graph 800 illustrating charge carrier distribution 801 for the exemplary organic memory cell is depicted in accordance with an aspect of the present invention. For this graph 800, parameters are set as follows: forward voltage=0.12V and current flux J=0. The CuS end has a higher voltage than the other end (organic polymer). This drives the charge carrier away from CuS layer and leads to charge carrier concentration that has an increase function of x. Even at lowest concentration p(0), it is not a small value for this case (e.g., its value is 3.32×10$^{19}$/ cm$^3$ for the case shown in FIG. 8). This explains why the polymer is a good conductor when forward voltage is applied. Again, it is Eq. 6 with constant electric field model used for the plot. The points demonstrated are independent of constant electric field assumption.

Figure 9:
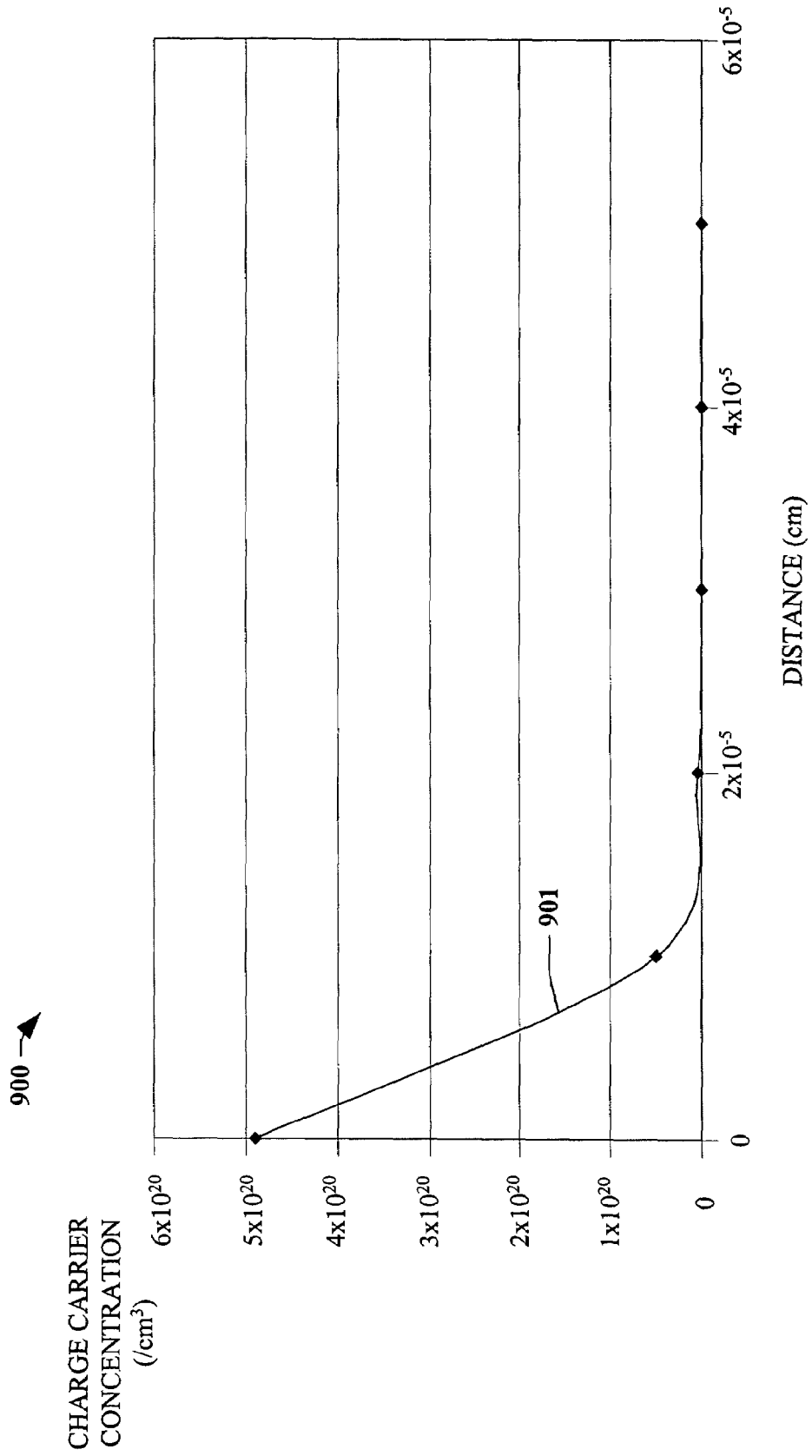
FIG. 9 is a graph illustrating charge carrier distribution of an exemplary memory cell in accordance with an aspect of the present invention.

FIG. 9 depicts yet another graph 900 of charge carrier distribution 901 of the exemplary memory cell as a function of distance from the CuS and organic polymer interface in accordance with an aspect of the invention. For this graph, the parameters are set such that the reverse voltage=0.28V and the current J=0. With reversed voltage, the charge carrier is concentrated at the CuS polymer interface and drops quickly to small concentration when it is away from the interface, which describes why the organic memory cell becomes non-conductive when high reversed voltage applied. Again, Eq. 6 with constant electric field model is assumed for the plot. The points demonstrated are independent of this assumption.

Figure 10:
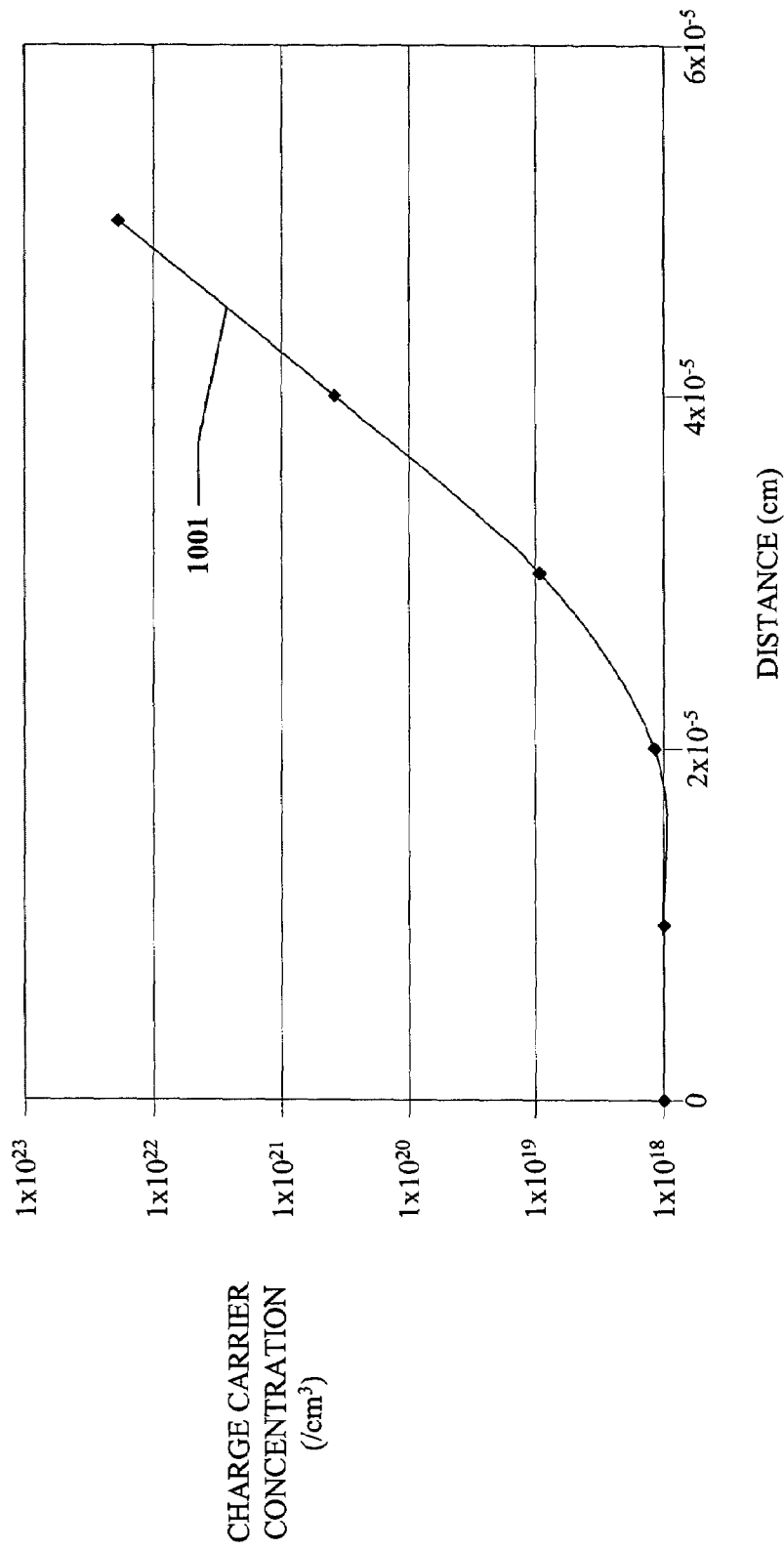
FIG. 10 is a graph illustrating charge carrier distribution of an exemplary memory cell in accordance with an aspect of the present invention.

Referring now to FIG. 10, another graph 1000 that depicts charge carrier distribution 1001 of the exemplary memory cell as a function of distance in accordance with an aspect of the present invention is provided. For this graph 1000, parameters are set as follows: forward voltage=0.52V and current flux J>0 ($p_j$= 10$^{18}$/cm$^3$). When current flux J>0, the charge carrier is still an increase function of x because the forward voltage drives the charge carrier away from CuS interface. One important point is that the lowest concentration p(x) is at interface.

Figure 11:
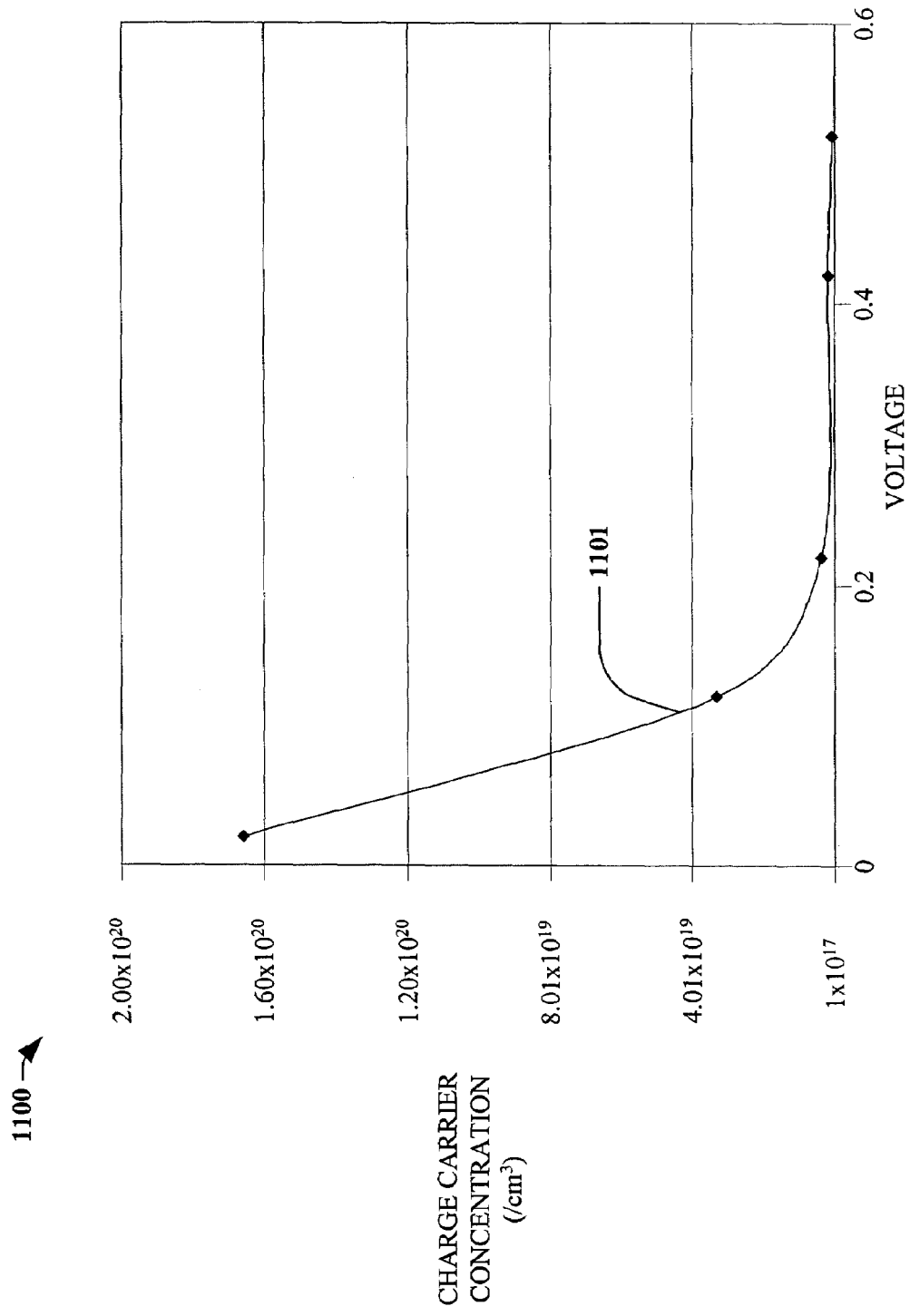
FIG. 11 is a graph illustrating charge carrier concentration at the interface of an exemplary memory cell in accordance with an aspect of the present invention.

FIG. 11 depicts yet another graph 1100 of charge carrier concentration at interface 1101 of the exemplary memory cell as function of forward voltage V. For this graph, the parameters are set such that J>0 ($p_j$=10$^{18}$/cm$^3$) and assumes a constant electric field model. This model assumes the electric field in the cell is constant. Therefore, the voltage V(x) is described as a linear function. This model is applicable when the diffusion constant of the polymer is small and there is constant electric resistance. With this model, the charge carrier concentration at interface is derived as function of voltage. It is noted that $p_0(V)$ tends to be constant after forward voltage is large enough and the current is controlled by the charge carrier not charge injection at the interface. As such, p(0) can be rewritten as:

$$p(0) = \frac{1}{2}\left\{-K_{eq}[Polymer]_0 + \sqrt{(K_{eq}[Polymer]_0)^2 + \frac{4d_{CuS}K_{eq}[Polymer]_0[CuS]_0}{d}}\right\} \qquad (10)$$

This Eq. 10 shows that limiting p(0) is an increase function of thickness ratio between CuS layer and polymer layer.

Figure 12:
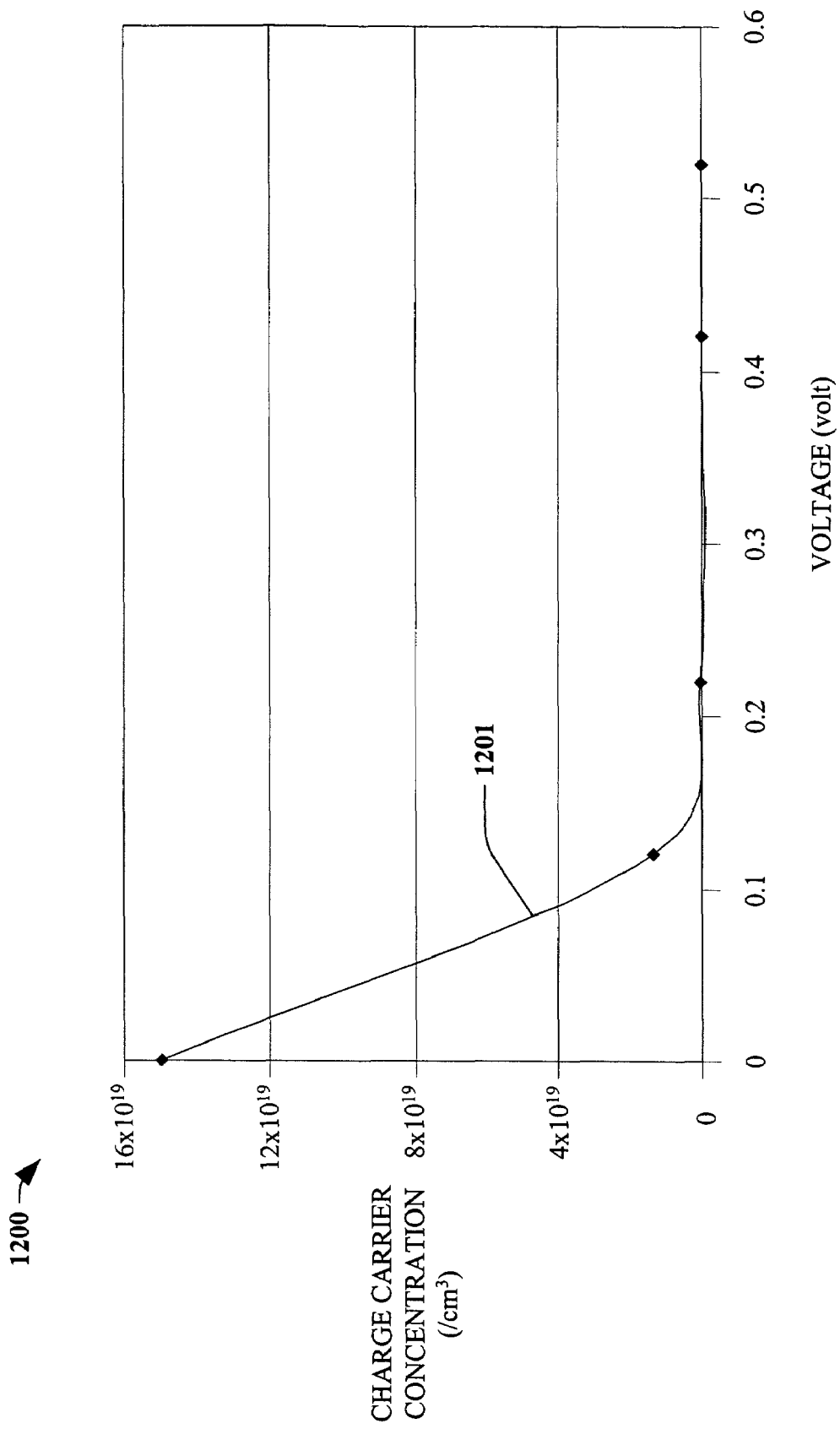
FIG. 12 is a graph illustrating charge carrier concentration at the interface of an exemplary memory cell in accordance with an aspect of the present invention.

FIG. 12 illustrates another graph 1200 that depicts charge carrier concentration at the interface 1201 of the exemplary memory cell as function of forward voltage V in accordance with an aspect of the present invention is provided. For this graph 1200, p(0) is a function of forward voltage, current J, which may or may not be >0, and a step potential function model. This model assumes the voltage V(x) function can be described by a step function. The model is applicable when the diffusion constant of the polymer is very large. Therefore, the electric resistance in the cell is trivial. With this model, the charge carrier concentration at interface is derived as the function of voltage. It is noted that in FIG. 12 that $p_0(V)$ tends to be zero after forward voltage is large enough. When the charge carrier at the interface controls the current flux, this value is a function of voltage. This zero limit behavior is due to the interface boundary limit set by the reaction (1). Basically, the fast charge carrier transportation from the interface to the other end reaches the supply limit. Thus, the limiting p(0) is also rewritten as:

$$p(0) = \frac{1}{2}\left\{-K_{eq}[\text{Polymer}]_0 + \sqrt{(K_{eq}[\text{Polymer}]_0)^2 + \frac{4d_{CuS}K_{eq}[\text{Polymer}]_0[CuS]_0}{d\left[\exp\frac{V(0)-V}{V_t} - \frac{V(0)-V}{V_t}\right]}}\right\} \quad (11)$$

Again p(0) is an increase function of thickness ratio between CuS layer and polymer layer.

Regarding the above discussion, it is important to note that the flux measured is determined by charge carrier drift when limiting flux is in the polymer. Under constant electric field assumption, the function to describe the charge carrier concentration is $p(x).p_j=p(0)$ is met when the polymer determines limiting flux since the lowest concentration in the cell is at the interface. This condition results in a constant p(x). This means the diffusion contribution to the flux in Eq. 5 is zero. Under step potential assumption, another function is employed to describe the charge carrier concentration p(x). The initial charge carrier concentration p(0) has a relatively substantially smaller value than other regions. Therefore, J is still determined by p(0). Another point that is noted regards boundary conditions. Unlike semiconductors, it is just applicable to the concentration at interface, not everywhere. This boundary condition limits the total amount of the charge carrier produced in the cell.

The equations supra (E.q. 1–7) and the FIGS. 9–12 describe and model behavior of organic memory devices. This model can be employed to explain measured data and can be for other passive layer materials aside from CuS. Additionally, the model can be used to think about how to improve retention and response time and to design the other devices such as transistor. Further, the model can be employed to develop various threshold voltages that set conductivity levels (e.g., set states), read conductivity levels and erase the conductivity levels thus performing memory device operations of writing or programming, reading and erasing.

Figure 13:
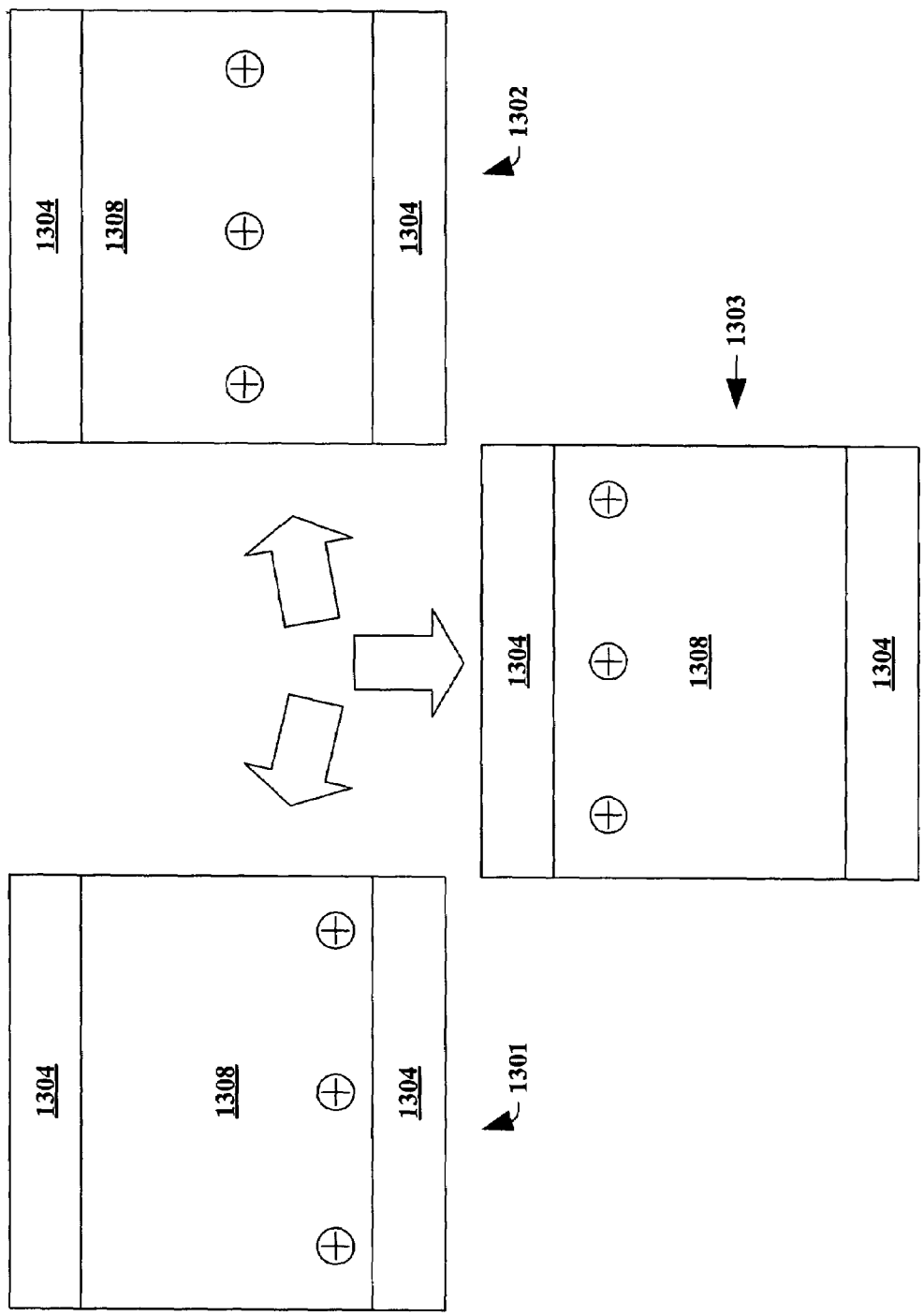
FIG. 13 is a block diagram depicting an organic memory device in various states in accordance with an aspect of the present invention.

FIG. 13 is a block diagram that illustrates an organic memory device 1300 in various states in accordance with an aspect of the present invention. The device 1300 is depicted in a first "off" state 1301, an "on" state 1302, and a second "off" state 1303. It is appreciated that memory devices formed in accordance with the present invention can have other states than those depicted in FIG. 13. The organic memory device 1300 comprises a top electrode 1304, a bottom electrode 1306 and a selectively conductive layer 1308 comprising an organic layer (e.g., PPA) and at least one passive layer (e.g., CuS).

In the first off state 1301, a positive charge 1310 collects in the selectively conductive layer 1308 near the bottom electrode 1306. In the on state 1302, the positive charge 1310 is uniformly distributed thereby indicating an on state. In the second off state 1303, the positive charge collects in the selectively conductive layer 1308 near the top electrode 1304.

Figure 14:
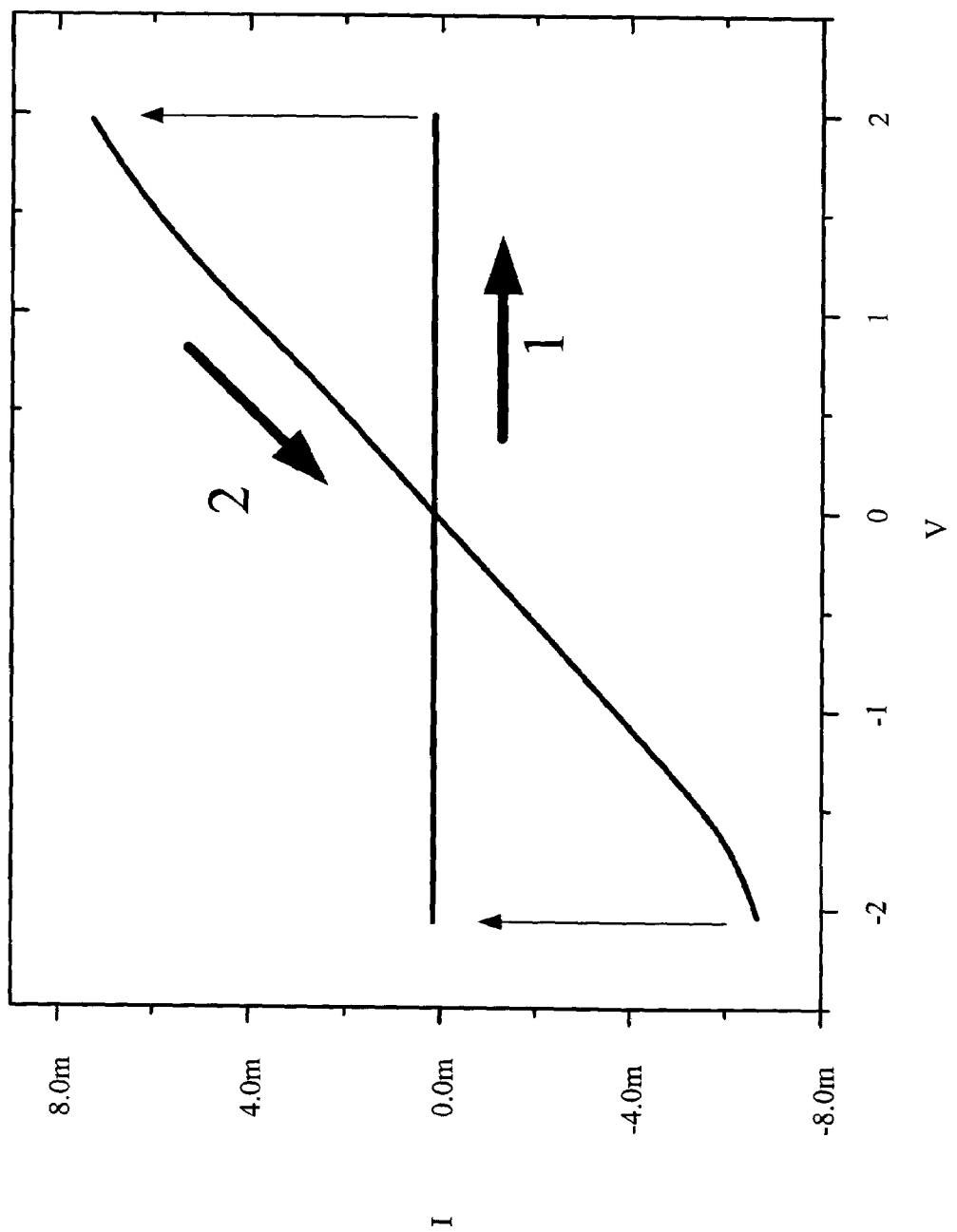
FIG. 14 is a graph illustrating I–V characteristics for an organic memory device in accordance with an aspect of the present invention.

FIG. 14 is a graph 1400 that illustrates I–V characteristics for the memory device 1300 described with respect to FIG. 13. It can be seen that from state 1, which indicates "off", the device can be modified to be in state 2, which indicates "on", by applying a positive voltage of 2V. Additionally, it can be seen that whilst in state 1, the organic memory device has a high impedance and low conductance. Subsequently, the device 1300 can be modified to change from state 2 to state 1 by application of a negative voltage, therein causing a reverse current until the state 1 is obtained.

Figure 15:
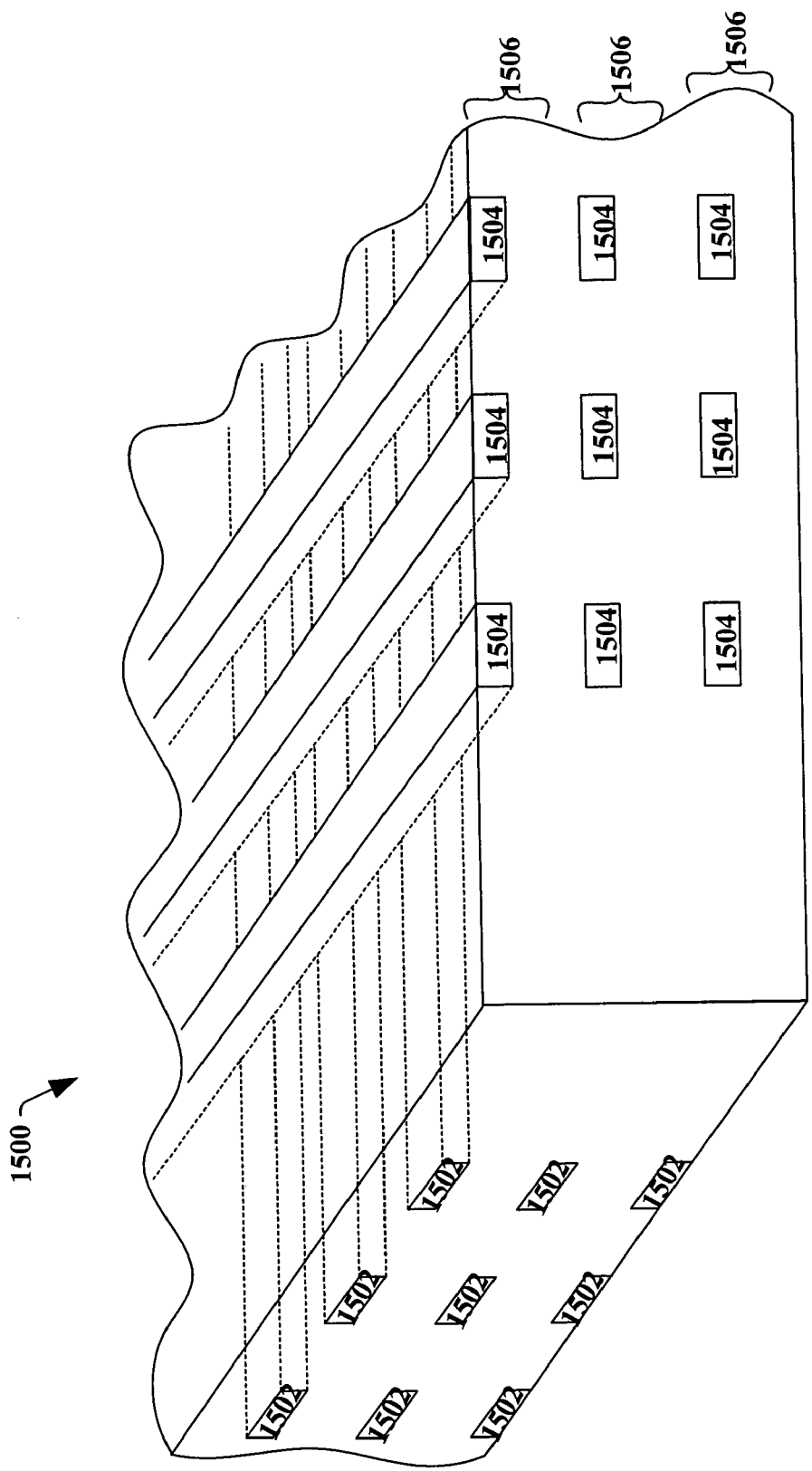
FIG. 15 is a three dimensional view of an organic memory device in accordance with an aspect of the present invention.

Referring to FIG. 15, a three dimensional view of an organic memory device 1500 containing a plurality of organic memory cells in accordance with an aspect of the invention is shown. The organic memory device 1500 contains a plurality of first electrodes 1502, a plurality of second electrodes 1504, and a plurality of memory cell layers 1506. Between the respective first and second electrodes are the controllably conductive media (not shown). The plurality of first electrodes 1502 and the plurality of second electrodes 1504 are shown in substantially perpendicular orientation, although other orientations are possible. The three dimensional microelectronic organic memory device is capable of containing an extremely high number of memory cells thereby improving device density. Peripheral circuitry and devices are not shown for brevity.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Figure 16:
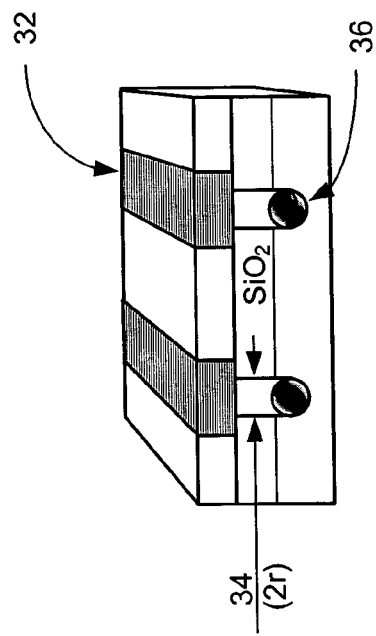
FIG. 16 illustrates a schematic cross section showing silver interconnect structure created on a wafer surface, according to the present invention.

Referring now to FIG. 16, a schematic cross section according to the present invention is illustrated showing a trench filled with Ag lining 32 and a via interconnect structure 34. Typically, as the via becomes narrower, its electrical resistance increases. Moreover, the increased resistance of the correspondingly thinner interconnects brings about a longer interconnect time delay. Typically, when the interconnect is a metallized via of radius "r", as shown in FIG. 16, the electrical resistance of the interconnect is proportional to its length "1" and inversely proportional to its cross-sectional area:

$R = \rho l/\pi.r^2$, where $\rho$ is the resistivity.

As such, the corresponding interconnect time delay becomes: $\tau = R.C = (\rho l/\pi\ r^2).C$, where C represents the capacitance proportional to the dielectric constant, and where a reduction of radius "r", causes an increase in time delay $\tau$.

Figure 17:
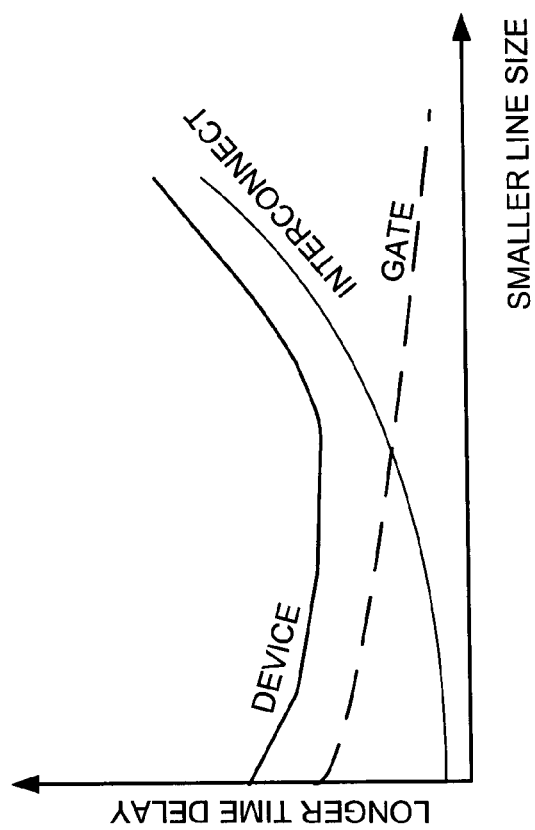
FIG. 17 illustrates a schematic representation of exemplary time delays in a semiconductor device employing a metallized via.

FIG. 17 illustrates a schematic representation of the time delays in a semiconductor device employing metallized vias. The top curve, which represents the overall time delay of the device results from the combined time delays of gate 36 and the time delay of the interconnect 34. As illustrated, the time delay of the gate 36 decreases as the line width becomes smaller. In contrast, the time delay of the interconnect 34 increases as the line width becomes smaller. As such, the overall time delay of the device, which consists of the sum of the time delays of the interconnect and the gate, increases sharply at small line widths. Employing silver for interconnect structure, according to one aspect of the present invention, lowers the resistivity value, and thus reduces the overall time delay of the device at smaller line sizes—compared to copper, which has a typical bulk resistivity of about $1.68\mu$ $\Omega$cm, silver has a bulk resistivity of about $1.59\mu$ $\Omega$ cm. In addition, silver has the ability to withstand CMP procedures, and thus can be employed for the metallization of the semiconductor connects, according to one or more aspects of the present invention.

In one aspect of the present invention, an additional layer (not shown) between the Ag film and underneath dielectric is provided to improve adhesion and to block the diffusion of Ag atoms. One example of this barrier is a thin oxynitride ($Al_x$ $O_y$ $N_z$) that can be formed by employing a bilayer configuration of Ag/Al and annealing it in ammonia ambient. Other forms of barrier configurations can be obtained by employing Ti or Cr as the added metal layer with Ag, and annealing in an appropriate ambient.

Moreover, an Ni—B deposit can be employed as a cap layer during the Ag damascene process. The Ni—B layer can be deposited via an electroless plating by employing an appropriate reducing agent or sodium hydrophosphate.

Figures 18, 18A:
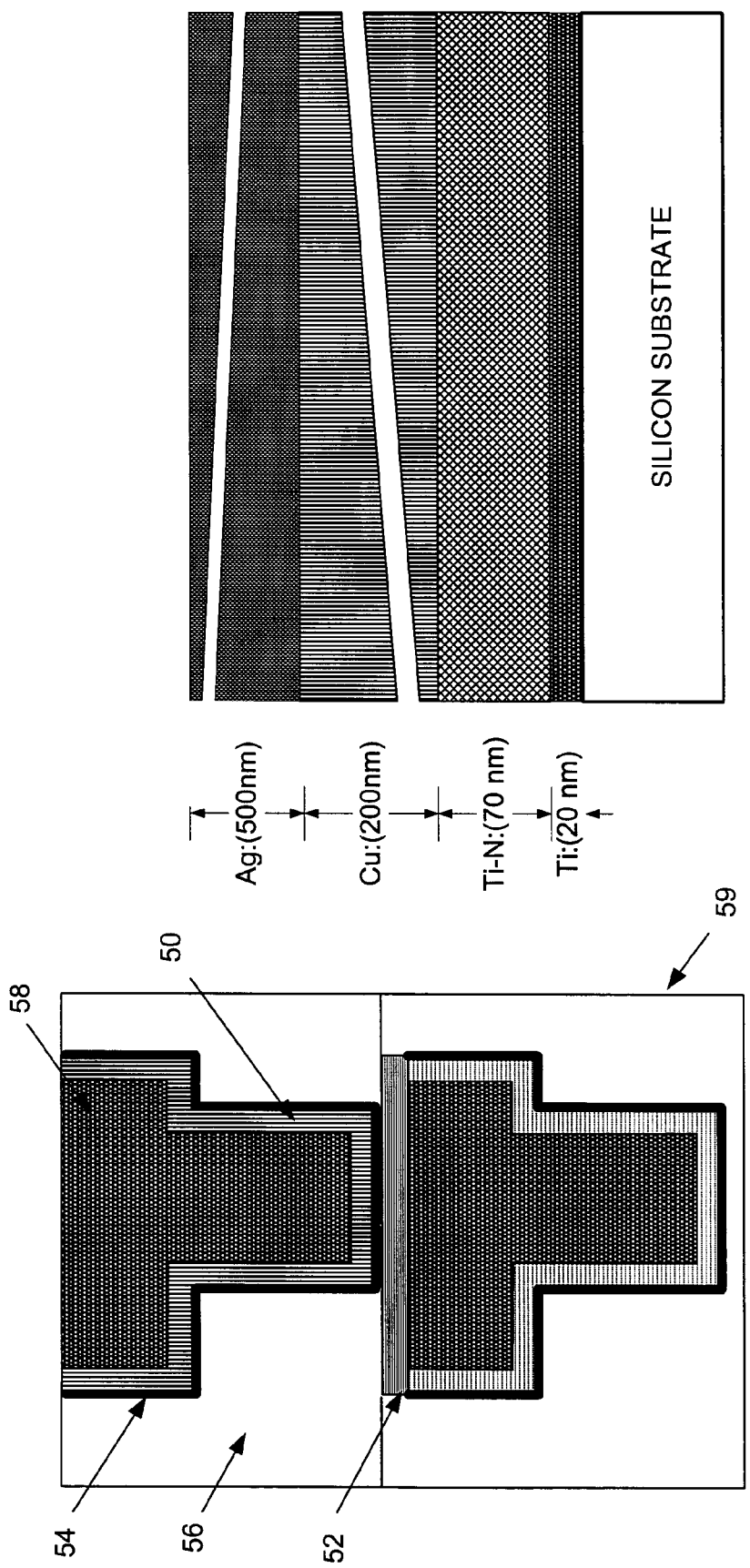
FIG. 18 illustrates a schematic exemplary representation of silver damascene interconnects in accordance with an aspect of the present invention.
FIG. 18(a) illustrates a schematic configuration of the various layers associated with silver damascene interconnects according to one aspect of the present invention.

Referring now to FIG. 18, formation of a silver interconnect according to one aspect of the present invention is illustrated. Initially and during semiconductor fabrication process, an interconnect trench is etched in a dielectric material 56 overlaying a silicon substrate or any other existing layer(s) 59. Any suitable etching process can be employed to replicate the mask pattern of the desired patterned photoresist layer for creating the trench in the dielectric layer 56; for example; anisotripically etching with a plasma gas(es) (e.g., as carbon tetrafloride ($CF_4$) containing fluorine ions in a commercially available etcher, (e.g. a parallel plate RE apparatus); or, alternatively, etching via an electron cyclotron resonance (ECR) plasma reactor, or the like.

Within the formed trench, a barrier layer 54 is deposited, which is subsequently covered by an electrode layer, e.g. a Cu layer 50. An exemplary configuration illustrating the layers associated with an Ag interconnect is depicted in FIG. 18(*a*). As shown, the Cu layer can have a thickness of 200 nm, which in turn overlays a Ti/TiN barrier layer having a 20 nm/70 nm respective thickness that has been deposited earlier, via for example a sputtering technique.

Any suitable technique (e.g., thermal oxidation, plasma enhanced chemical vapor deposition (CVD), thermal enhanced CVD and spin on techniques) may be employed in forming the Cu layer 50. Upon this Cu layer, an Ag metal layer 58 is deposited, for example via an electro-chemical plating process. In one exemplary aspect, the electro chemical plating process is performed by employing $KAg(CN)_2$ (0.03 mol/L), KCN (0.23 mol/L), at a PH of 11 and a temperature of 25° C., with a pulse electric density of 10 $mA/cm^2$. The formed Ag metal layer electrode layer is then polished by employing a CMP process as described in further detail according to FIG. 20. In one aspect according to the present invention, a silver interconnect could further include a cap layer 52 comprising an Ni—B chemical composition that has been platted via an electroless plating process. The cap layer can affect the resistance capacitance delays associated with the semiconductor device. Subsequently, the post CMP surface of the silver interconnect is exposed to various cycles of acid treatment, as further discussed with reference to FIG. 22. The treated silver interconnect forms the substrate of an organic memory cell created thereupon.

Figure 19:
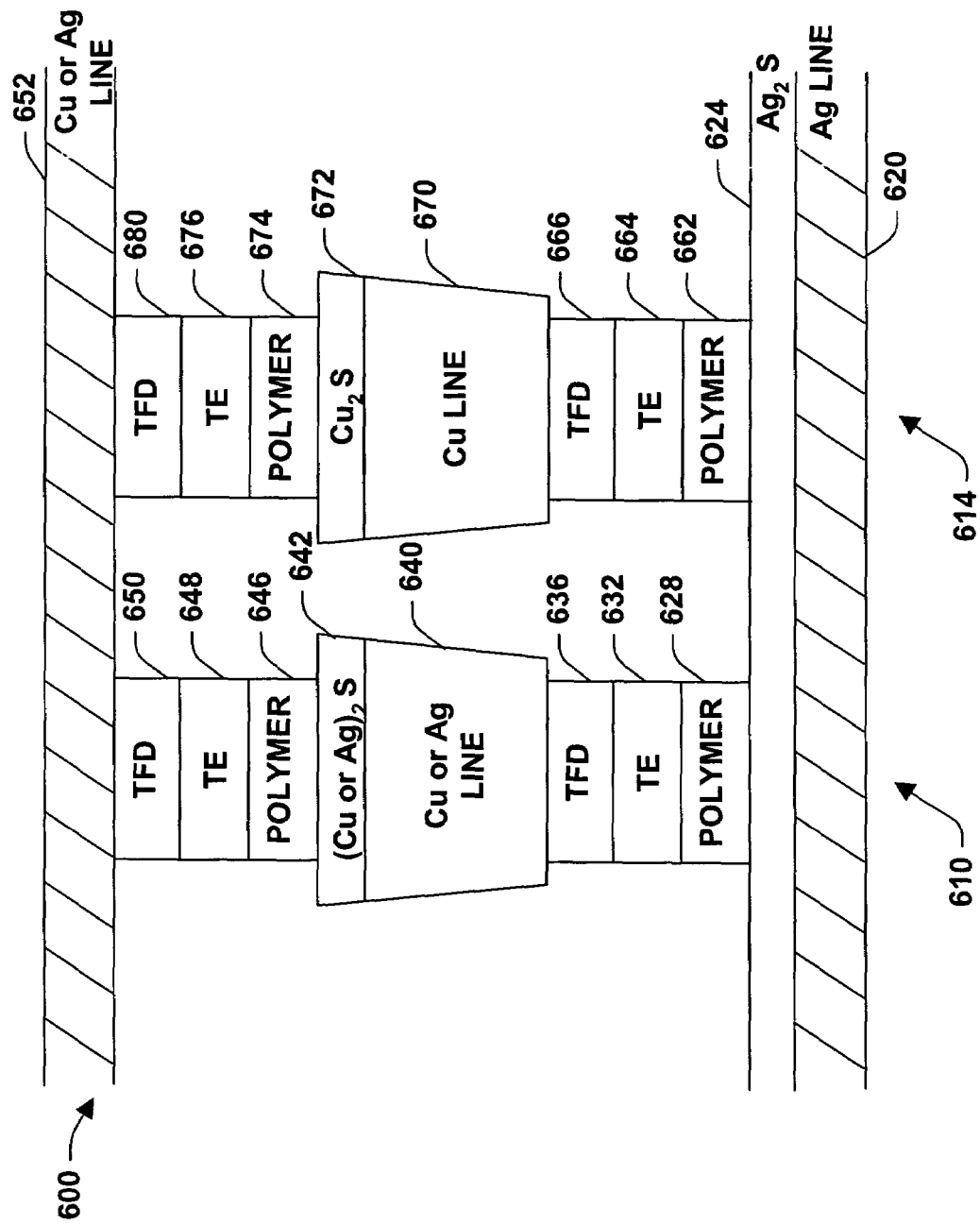
FIG. 19 illustrates a stacked memory device fabricated in accordance with an aspect of the invention.

FIG. 19 illustrates an exemplary stacked memory device 600 in accordance with an aspect of the present invention. The stacked memory device 600 depicts two vertical columns 610 and 614, wherein respective columns include two layers of organic memory cells. As noted above, it is to be appreciated that the stacked memory device 600 is also exemplary in nature in that two columns and layers are illustrated, however, a plurality of such columns and/or layers (number of layers do not need to match number of columns) can be provided. Moreover, alternative materials from that shown in FIG. 19 can be employed to form the stacked memory device 600 and are described in more detail below.

The stacked memory device 600 can be constructed in accordance with a pillar approach that employs constructing multiple layers then etching pillared columns from the layers. The following discussion is related to the vertical column 610 and can be similarly applied to the vertical column 614. Vertical column 614 includes a silver line, 620 (e.g., global access line) having a passive $Ag_{2-x}S_y$ layer 624 formed thereon. A polymer layer 628, a top electrode 632 are formed above the passive layer 624, wherein a thin film diode 636 (TFD) is then formed above the top electrode 632 (TFD may be several layers as discussed above) before formation of a subsequent memory layer. After the TFD 636 is formed, another memory structure is formed having a conductive line 640, a passive layer 642, a polymer layer 646, and a top electrode 648, wherein a subsequent TFD 650 and conductive layer 652 is then formed. The vertical column at 614 is similarly constructed from components 662–680.

It is noted that the pillared approach illustrated by the memory device 600 may include the formation of a plurality of layers (e.g., silver, passive, polymer, electrode, TFD, copper or silver, passive, polymer electrode TFD and the like) before formation of vertical columns (e.g., columns 610 and 614) that are subsequently etched from the preceding layers. Alternatively, a subset of layers may be formed (e.g., silver, passive, polymer, electrode, TFD), wherein vertical columns are then formed in the subset, then another subset of layers are formed over the existing vertical columns, whereby other vertical columns can then be formed in the subsequent layered subset. The processes employed in accordance with the present invention can be repeated to increase memory device density. In one aspect according to the present invention the passive layer 624 is grown on silver layer 620 after a CMP and an acid exposure process is performed on various portions of the silver layer 620.

Figure 20:
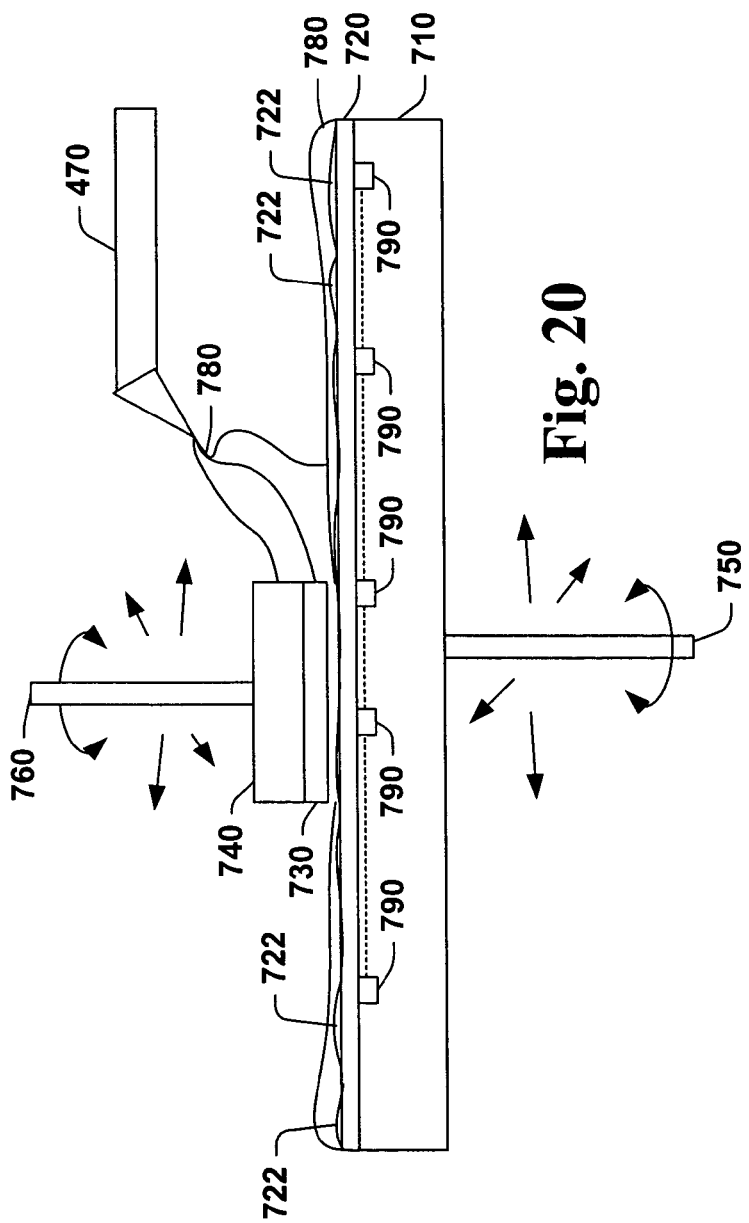
FIG. 20 illustrates a representative schematic of a wafer undergoing CMP processing in accordance with one or more aspects of the present invention.

The CMP process is now described in detail by referring to FIG. 20, a schematic illustration of a wafer 710 undergoing a CMP process in accordance with one or more aspects of the present invention is shown. The wafer 710 and photoresist 720 comprising uneven spots 722 move relative to a polishing pad 730 situated within a platen 740 via a wafer carrier 750 and spindle 760 to which the wafer 710 and pad 730 are respectively operatively attached. A slurry dispenser 770 selectively provides slurry 780 to particular locations on the pad 730 and/or wafer 710 based, at least, in part, on measurements of slurry distributions obtained from sensors 790 situated within the wafer 710. The CMP process can remove 100 Å–500 Å in some applications, or thousands of Å in other applications. Such exemplary ranges are appropriate for T-tops or silicon grass applications of the photoresist layer. The CMP processing as discussed herein may be suitably tailored to remove any desired thickness of the photoresist layer (e.g. from 50 Å to 10,000 Å).

The slurry 780 is applied with the capability to react with the photoresist 720 at the surface/subsurface range. The degree of reaction should not be great enough to cause rapid or measurable dissolution of the photoresist, but should modify chemical bonding in the resist surface layer to facilitate surface layer removal by applied mechanical stress. Numerous chemicals that attack photoresist may be effective, including base solutions (e.g. KOH or $(CH_3)_4NOH$). The rate and extent of reaction depends upon the base concentration. Bases employed in the slurry can include hydroxide compounds, silicate compounds, carbonate and bicarbonate compounds. By way of example, hydroxide compounds employed in the slurry can include alkali metal hydroxides, such as; sodium hydroxide and potassium hydroxide, alkaline earth metal hydroxides such as calcium hydroxide and magnesium hydroxide, ammonium hydroxides such as ammonium hydroxide and quaternary alkyl ammonium hydroxides, phosphonium hydroxides, and sulfonium hydroxides such as sulfonium hydroxide and tertiary alkyl sulfonium hydroxide. Similarly, the silicate compounds, carbonate and bicarbonate compounds that are employed in the slurry can include alkali metal, alkaline earth metal, ammonium, phosphonium and sulfonium silicates, carbonates and bicarbonates.

The CMP methodology may also be programmed with data and information regarding pad attributes and slurry properties, including for example the slurry's concentration, formula, pH, particle size and density. As CMP progresses, the system may be updated to monitor and record the processing characteristics, such as changes in: slurry distribution, polishing pad attributes, photoresist properties (e.g. thickness, planarity), pressure or motion information.

Figure 21:
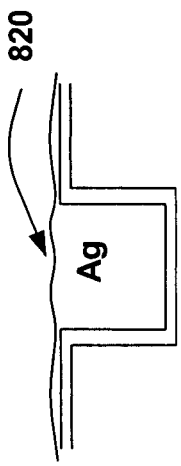
FIG. 21 illustrates a representative schematic of a wafer surface with silver interconnects after the completion of the CMP in accordance with an aspect of the present invention.

Referring to FIG. 21, a portion of a wafer surface after the completion of a CMP process is illustrated. The micro scratches and surface irregularities 820 are formed on the polished wafer surface as a result of the CMP process. Generally, these irregularities can adversely affect the formation of the memory cells, since the memory cells require the passive layer to be typically flat and substantially free from surface irregularities. Nonetheless, such micro-structures and surface irregularities are generally present on the surface of the wafer after completion of the CMP process.

By referring to FIGS. 22(a) through 22(f), the post CMP surface treatment of the wafer for substantially removing the formed surface irregularities and micro scratches, according to one aspect of the present invention, will now be described. FIG. 22(a) illustrates the surface of the wafer with various surface micro irregularities created thereupon after the CMP process. In one aspect according to the invention the wafer surface, can be subject to an oxidation process. Next, as illustrated in FIG. 22(b), portions of the surface 917 are being brought in to contact with an inorganic acid 925. The inorganic acid can be for example, an $H_2S$, $HNO_3H_3PO_4$, HCL, or the like. The inorganic acid 925 and the surface 917 of the wafer then chemically react as to create various depressions 920 on the surface of the wafer, as the inorganic acid eats into the surface of the wafer. The properties associated with the chemical reaction (e.g. acid concentration, duration of exposure to the acid, and the like), can be controlled based on the desired characteristics of the depressions to be formed. In one aspect according to the present invention, on the surface of the wafer is an overlaying a silver (Ag) layer, with the chemical reaction forming a trench like depression that extends in to the Ag layer.

Referring now to FIG. 22(c), the formed depressions 920 are being employed for growing a passive layer, (e.g. an $Ag_2S$ layer), for the memory cells that are subsequently created thereupon. In one aspect according to the present invention $H_2S$ is brought into contact with the surface of the depression to facilitate creating the passive layer 923. The passive layer 923 thus formed has its rough surface crest 927 protruding out of the depression and extending beyond the initial post CMP surface level, as illustrated in FIG. 22(d). The passive multilayer will then be employed in forming the memory cells.

Subsequently, and as illustrated in FIG. 22(e), the surface 927 is brought in to contact with an organic acid 929. The acid 929 can be any of the organic acids such as; tartaric acid, ascorbic acid, succinic acid, fumaric acid, formic acid, citric acid, oxalic acid, malic acid, propionic acid, pyruvic acid or the like. The resulting chemical reaction is controlled such that the rough and jagged portions of the surface 927 is being eroded and etched away and a smooth layer of passive material is being created. In one aspect according to the present invention, as illustrated in FIG. 22(f), the smooth surface area 924 is flat and is being isotropically etched in all directions simultaneously.

Figure 23:
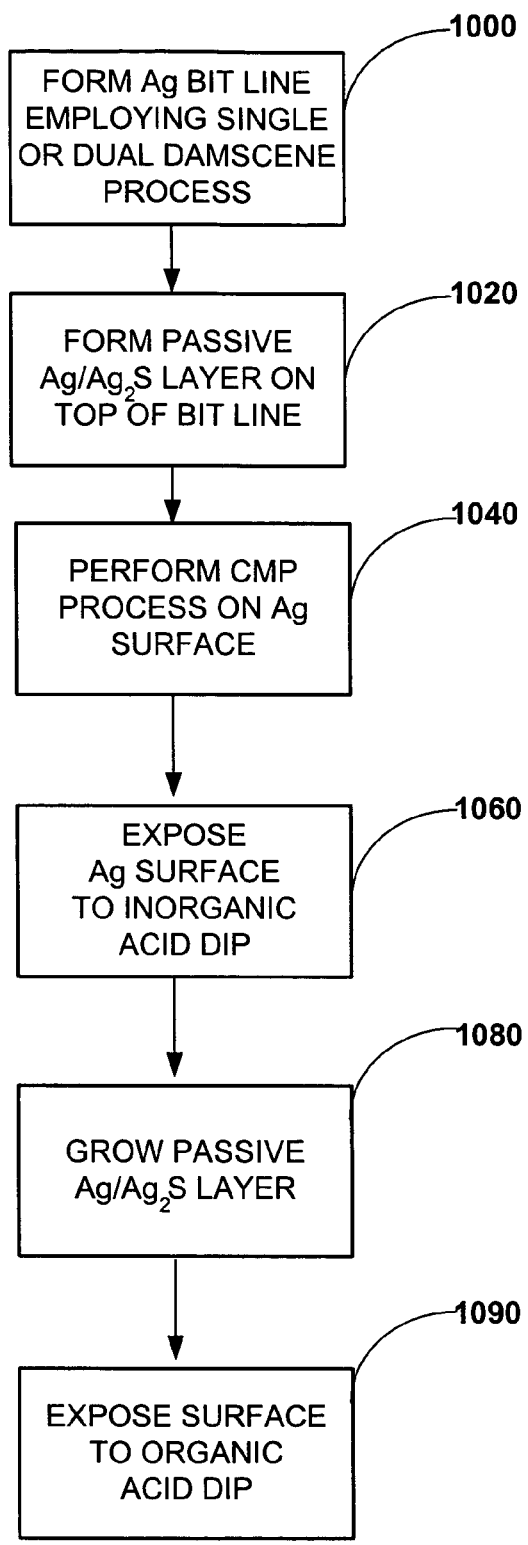
FIG. 23 illustrates a flowchart of a methodology for a post CMP Ag surface treatment according to one aspect of the present invention.

A flow chart of the methodology according to another aspect of the invention is illustrated in FIG. 23. In 1000, by employing a single or dual Damascene process a bit line is being formed on the surface of a wafer. This bit line can be comprised of a conductive material such as, silver, copper, aluminum, chromium, germanium, gold, magnesium, manganese, indium, iron, nickel, palladium, platinum, titanium, zinc, alloys thereof, indium-tin oxide, polysilicon, doped amorphous silicon, metal silicides, and the like. Exemplary alloys that can be utilized for the conductive material include copper alloys, Hastelloy®, Kovar®, Invar, Monel®, Inconel®, brass, stainless steel, magnesium-silver alloy, and various other alloys.

Next and at 1020 of FIG. 23, a passive layer is being formed on top of the bit line. The passive layer contains at least one conductivity facilitating compound that has the ability to donate and accept charges (holes and/or electrons). Generally, the conductivity facilitating compound has at least two relatively stable oxidation-reduction states which permit the conductivity facilitating compound to donate and accept charges. Examples of conductivity facilitating compounds that can be employed for the passive layer include one or more of the following: silver sulfide ($Ag_2S$, AgS), copper sulfide ($Cu_2S$, CuS), copper oxide (CuO, $Cu_2O$), manganese oxide ($MnO_2$), titanium dioxide ($TiO_2$), indium oxide ($I_3O_4$), iron oxide ($Fe_3O_4$), and the like.

The passive layer may be grown using oxidation techniques, formed via gas phase reactions, deposited between the electrodes. In one aspect according to the present invention the passive layer is being formed via an electroless process, which will be discussed in more detail in the paragraphs below by referring to FIG. 24. The passive layer is operative to transport charge from the first electrode to the interface between the organic layer and the passive layer. Additionally, the passive layer facilitates charge carrier (e.g., electrons or holes) injection into the organic layer and increases the concentration of the charge carrier in the organic layer resulting in a modification of the conductivity of the organic layer. Furthermore, the passive layer can also store opposite charges in itself in order to balance the total charge of the memory cell. The passive layer can, in some instances, act as a catalyst when forming the organic layer. In this connection, the backbone of the conjugated organic molecule may initially form adjacent the passive layer, and grow or assemble away and substantially perpendicular to the passive layer surface. As a result, the backbones of the conjugated organic molecule may be self aligned in a direction that traverses the two electrodes.

Subsequently at 1040 of FIG. 23, a CMP process is carried out on the passive layer. This may create a series of micro scratches and surface irregularities on the surface of the passive layer that, if untreated, may adversely affect the formation of the organic layer of the memory cell. Accordingly, to address this problem in 1060 the post CMP surface of the passive layer is exposed to an inorganic acid, which as explained before can be any of an $H_2S$, $HNO_3H_3PO_4$, HCL, or the like. The exposure of the post CMP surface with the inorganic acid initiates a chemical reaction that results in voids or surface depressions being created in the surface of the wafer.

Referring now to 1080 of FIG. 23, the created voids are employed to grow a passive layer inside. This can be accomplished by initially exposing the surface of wafer, which shapes the void, to an $H_2S$ solution, or the like which facilitates the growth of the passive layer. In one aspect according to the present invention the passive layer is formed via an electroless plating process. The process includes depositing an activation compound on selected areas and then applying a chemical solution, which contains a reducing agent and metal ions. Thus, a chemical reaction occurs reducing the metal ions and thereby plating the metal ions and forming a conductive layer.

Next, at 1090 of FIG. 23, the grown passive layer is brought into contact with an organic acid as to create a smooth surface for the passive layer. As explained earlier, the organic acid can be a tartaric acid, ascorbic acid, succinic acid, fumaric acid, formic acid, citric acid, oxalic acid, malic acid, propionic acid, pyruvic acid or the like. This etching process can be continuously monitored as to control the etch depth and thus obtain a smooth surface. Also, in-situ optical techniques such as ellipsometry and reflectometry can be used to control the etching process and requisite adjustments be made in the temperature of the etchant or the chemical strength or concentration of the etch solution.

According to one aspect of the present invention an $Ag/Ag_2S$ layer in the voids is being formed via an electro less process. This process occurs by chemical reaction from an aqueous metal salt solution also containing a reducing agent. This metal deposition is operative to be performed at about 35–75° C. Unlike electroplating processes, no external power supply is required. A wafer containing the voids formed thereupon after being exposed to the inorganic acid is placed in contact with the solution. Metal ions and a reducing agent react on a catalytic surface (e.g., activation compound) that has previously been deposited. Thus, passive layer as well as any other required electrode can be formed in selected and electrically isolated areas at the same time, which is not generally possible with other techniques such as electroplating. Further, the $Ag/Ag_2S$ layers can be formed within trenches or vias by utilizing the electroless metal deposition process.

Figure 24:
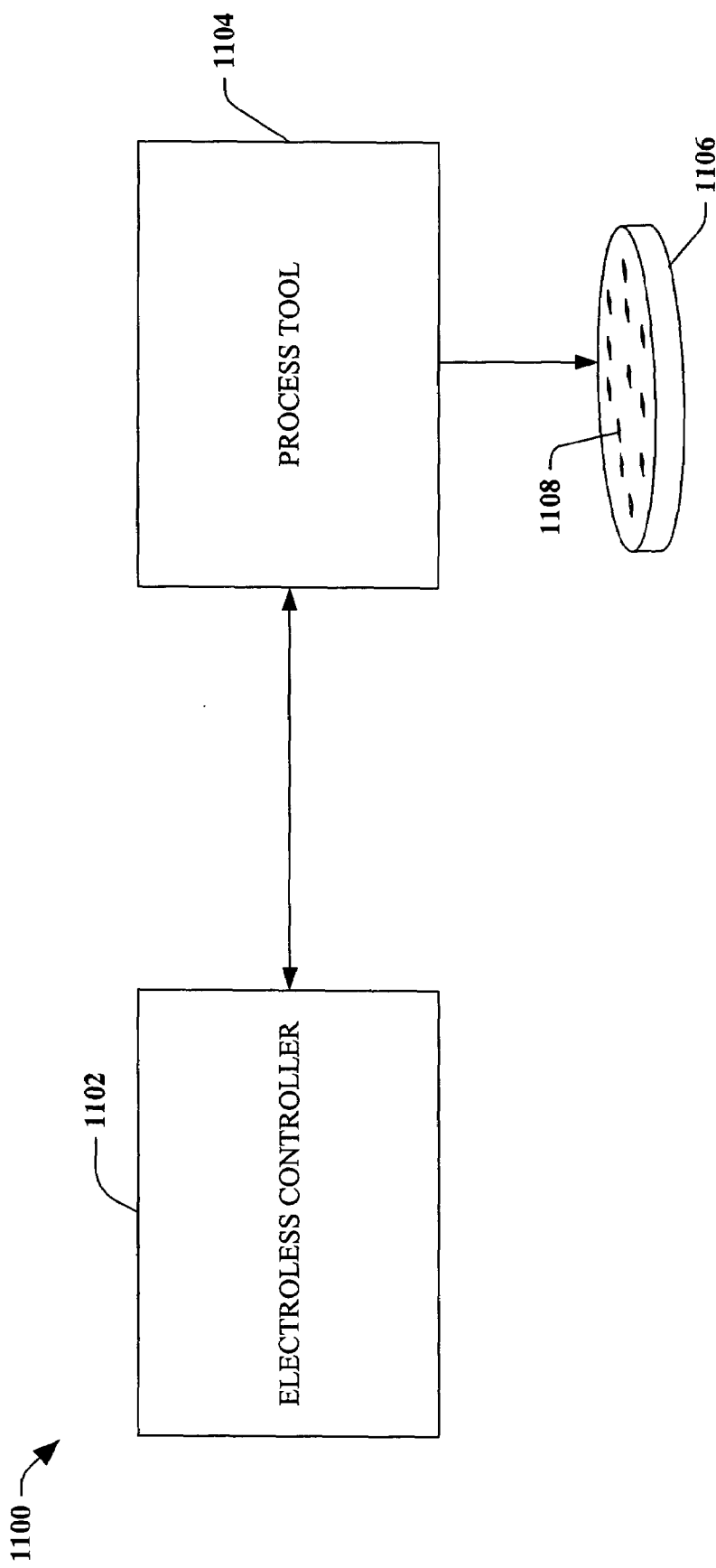
FIG. 24 illustrates a block diagram of an electroless process in accordance with an aspect of the present invention.

Turning now to FIG. 24, a block diagram of a system 1100 for electroplating in accordance with an aspect of the present invention is depicted. Typically, a silver electroless plating bath (not shown) includes water, a water soluble compound containing the metal silver that is to be deposited onto selective areas of the wafer surface, a complexing agent, such as ammonium hydroxide, which prevents chemical reduction of the silver metal ions in solution while permitting selective chemical reduction on a surface of the wafer, and a chemical reducing agent for the silver metal ions, (e.g. hydrazine hydrate). Additionally, the plating bath can include a PH controller (e.g. a buffer) and various optional additives, such as bath stabilizers (e.g. ammonium carbonate) and surfactants. The composition of a plating bath can vary based on the requirements of the plating process.

The system 1100 includes an electroless controller 1102, a process tool 1104 and the wafer 1106 to be electroplated in certain areas. The wafer 1106 has memory device(s) 1108 being fabricated on/in it. Specifically, the system 1100 is operative to form a passive layer in the surface voids of the wafer, as part of the memory device 1108 by utilizing an electroless process. The electroless process is a metal plating process that does not require or utilize a power source and/or electricity in order to plate metal.

The electroless controller 1102 is operative to interface with the process tool 1104 so as to controllably perform the formation of the passive layer and electrode fabrication process. The controller 1102 determines and controls a number of test parameters for the fabrication process such as activation compound, metal ions, thickness of the passive layer and/or other electrodes, duration of process, the PH level of the process, temperature and the like. These test parameters are selected and/or determined to meet design and/or process goals for the electrode fabrication process for this memory device. Simulations, modeling, neural networks, Bayesian networks, Bayesian belief networks and other mechanisms can be employed to determine the test parameters. It is appreciated that the electrode fabrication process, as well as the formation of the passive layer, is typically one of many fabrication processes required for the memory device 1108. The electroless controller 1102 can be implemented on a computer and/or as a computer component.

Although not so illustrated, the electroless controller 1102 is able to receive and process feedback and feed forward information during the electrode fabrication process. While the test parameter techniques discussed earlier are generally sufficient, real world results can vary. Thus, based on the feedback information, the electroless controller 1102 is able to dynamically modify the test parameters to more closely obtain desired $Ag/Ag_2S$ layer dimensions whilst mitigating damage and/or decomposition to existing structures on the memory device.

As stated earlier, the process tool 1104 is controlled by the electroless controller 1102 and performed the desired process on the memory device 1108. The process tool 1104 is the system component that physically and controllably performs fabrication process (e.g., by dispensing resist, patterning, rotating a wafer, etching and the like) according to test parameters. The process tool 1104 controllably and selectively deposits the activation compound, which can also be referred to as a seed layer. Additionally, the process tool 1104 initiates and controls flow of the chemical solution of a reducing agent and metal ions. In addition to controlling the fabrication process, the process tool 1104 also includes components and/or devices that gather fabrication information during fabrication (e.g., in situ) and/or after fabrication (e.g., inspection). This fabrication information can include, for example, critical dimensions (e.g., in x and y directions, width and pitch (2D and 3D), temperature, pressure, overlay, defect and the like). Pitch measurements are measurements between substantially equivalent features. Width measurements are measurements of a single feature. Typically, devices such as scanning electron microscopes (SEM) and optical microscopy are utilized to obtain the measurements.

Referring once again to the electroless controller 1104, the $Ag/Ag_2S$ layer and/or any other electrode fabrication process is generally initiated by first selectively depositing an activation compound, such as a hydrazine reducer. This activation compound is deposited in those locations of the wafer 1106 wherein an $Ag/Ag_2S$ layer is desired, i.e. within the created voids. Any other suitable activation compound can be employed, which typically acts as a catalyst for the desired reaction. Then, the chemical solution comprising a reducing agent and metal ions is applied to the wafer 1106 by a suitable mechanism. One such mechanism is to immerse the wafer 1106 in a bath of the chemical solution. The metal ions can be silver, nickel, cobalt, chromium, copper, and the like in order to form an electrode comprised of silver, nickel, cobalt, chromium, copper, other suitable materials, and/or alloys thereof. Additionally, alloys with copper and alloys with phosphor and boron can also be formed and employed.

The $Ag/Ag_2S$ layer(s) are then formed by an electroless reaction which includes two partial reactions, oxidation and reduction. The reduction causes the metal ions to form on the surface of the wafer 1106 at the locations where the activation compound has been deposited. This electroless reaction occurs at relatively low temperatures of about 35–75° C. As such, the passive layer, e.g. the $Ag/Ag_2S$ layer(s) is thus within the voids and surface depressions according to one aspect of the invention. In one aspect according to the present invention, the process employs at least one of ammonium carbonate, ammonium bicarbonate, ammonium hydroxide and hydrazine reducer.

Although the invention has been shown and described with respect to certain illustrated aspects, it will be appreciated that equivalent alterations and modifications will occur to others skilled in the art upon the reading and understanding of this specification and the annexed drawings. In particular in regard to the various acts performed according to one or more aspects of the invention, it is appreciated that an act may be comprised of various sub-acts and, while a particular feature of the invention may have been disclosed with respect to only one of several implementations, such feature may be combined with one or more other features of the other implementations as may be desired and advantageous for any given or particular application. Thus, the spirit and scope of the appended claims should not be limited to the descriptions of the versions contained herein.

What is claimed is:

1. A method for fabricating an organic memory cell comprising:

forming a substrate silver layer having a surface that acts as a base for an organic memory cell to be created thereupon;

performing a CMP process on the surface;

exposing the post CMP surface to an inorganic acid for shaping a surface depression thereupon;

growing a passive layer within the depression; and applying an organic acid to a surface of the grown passive layer, such that a substantially smooth surface texture is obtained.

2. The method of claim 1, further comprising;

forming a dielectric layer over the passive layer; and forming a layer of organic material over the passive layer.

3. The method of claim 1, further comprising:

plating the passive layer by an electroless process.

4. The method of claim 3, further comprising:

controlling the plating process by a controller.

5. The method of claim 1, further comprising:

etching a surface protrusion of the passive layer to a post CMP surface level.

6. The method of claim 1, further comprising:

exposing the post CMP surface to the inorganic acid in several cycles, and applying the organic acid in several cycles.

7. A method for planarizing a CMP processed silver interconnect surface comprising:

providing a CMP processed silver interconnect having an initial surface with micro scratches;

exposing the initial surface to an inorganic acid for shaping a void thereupon;

growing a passive layer comprising $Ag_2S$ within the void, such that a surface of the passive layer forms a protrusion out of the void, extending beyond the initial surface; and exposing the passive layer to an organic acid.

8. The method of claim 7, further comprising:

selectively depositing an activation compound over the void;

applying a chemical solution to the activation compound as to initiate an electroless reaction, the chemical solution comprising silver metal ions as well as a reducing agent; and reducing the metal ions of the chemical as to plate the passive layer within the void.

9. The method of claim 7, further comprising:

growing an $Ag_2S$ or an Ag layer.

10. The method of claim 8, further comprising:

employing at least one of an ammonium hydroxide, an ammonium carbonate, and an ammonium bicarbonate, in the chemical solution.

11. The method according of claim 8, further comprising:

controlling the growing of the passive layer within the void.

12. The method according to claim 8, further comprising:

employing a hydrazine reducer.

* * * * *